US009620193B2

(12) United States Patent
Hwang et al.

(10) Patent No.: US 9,620,193 B2
(45) Date of Patent: Apr. 11, 2017

(54) SEMICONDUCTOR MEMORY DEVICES, MEMORY SYSTEMS INCLUDING REFRESH CONTROL CIRCUIT AND METHOD OF PERFORMING WEAK REFRESH OPERATION ON THE WEAK PAGES THEREOF

(71) Applicant: Samsung Electronics Co., Ltd., Suwon-si (KR)

(72) Inventors: Doo-Hee Hwang, Seongnam-si (KR); Sang-Kyu Kang, Anyang-si (KR); Dong-Yang Lee, Yongin-si (KR); Jae-Yeon Choi, Seoul (KR); Jong-Hyun Choi, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/793,749

(22) Filed: Jul. 8, 2015

(65) Prior Publication Data
US 2016/0133314 A1      May 12, 2016

(30) Foreign Application Priority Data
Nov. 11, 2014   (KR) .................. 10-2014-0155948

(51) Int. Cl.
*G11C 7/00*       (2006.01)
*G11C 11/406*   (2006.01)
*G11C 7/10*       (2006.01)

(52) U.S. Cl.
CPC ...... *G11C 11/40611* (2013.01); *G11C 7/1063* (2013.01); *G11C 11/406* (2013.01)

(58) Field of Classification Search
CPC ............ G11C 11/406; G11C 11/40615; G11C 2211/4061
USPC .................................... 365/222, 201, 189.02
See application file for complete search history.

(56) References Cited

U.S. PATENT DOCUMENTS

| 7,215,589 | B2 | 5/2007 | Dono et al. |
| 7,565,479 | B2 | 7/2009 | Best et al. |
| 7,734,866 | B2 | 6/2010 | Tsern |
| 7,742,356 | B2 | 6/2010 | Dono et al. |
| 8,634,260 | B2 | 1/2014 | Matsubayashi et al. |
| 2005/0099868 | A1* | 5/2005 | Oh ........................ G11C 11/406 365/201 |
| 2006/0146630 | A1* | 7/2006 | Sohn ..................... G11C 11/406 365/222 |
| 2009/0161459 | A1* | 6/2009 | Kohler .................. G11C 11/406 365/222 |
| 2013/0159617 | A1 | 6/2013 | Yu et al. |

(Continued)

*Primary Examiner* — Connie Yoha
(74) *Attorney, Agent, or Firm* — Muir Patent Law, PLLC

(57) ABSTRACT

A semiconductor memory device includes a memory cell array and a refresh control circuit. The memory cell array includes a plurality of memory cell rows. The refresh control circuit performs a normal refresh operation on the plurality of memory cell rows and performs a weak refresh operation on a plurality of weak pages of the plurality of memory cell rows. Each of the weak pages includes at least one weak cell whose data retention time is smaller than normal cells. The refresh control circuit transmits a refresh flag signal to a memory controller external to the semiconductor memory device when the refresh control circuit performs the weak refresh operation on the weak pages in a normal access mode.

18 Claims, 17 Drawing Sheets

(56) References Cited

U.S. PATENT DOCUMENTS

2013/0279283 A1 10/2013 Seo et al.
2013/0279284 A1 10/2013 Jeong
2014/0016421 A1 1/2014 Kim et al.
2014/0136774 A1 5/2014 Mangione-Smith
2014/0169114 A1 6/2014 Oh

* cited by examiner

SEMICONDUCTOR MEMORY DEVICES, MEMORY SYSTEMS INCLUDING REFRESH CONTROL CIRCUIT AND METHOD OF PERFORMING WEAK REFRESH OPERATION ON THE WEAK PAGES THEREOF

CROSS-REFERENCE TO RELATED APPLICATIONS

This U.S. application claims the benefit of priority under 35 USC §119 to Korean Patent Application No. 10-2014-0155948, filed on Nov. 11, 2014, in the Korean Intellectual Property Office, the contents of which are incorporated herein in their entirety by reference.

BACKGROUND

Example embodiments relate to memory devices, and more particularly to semiconductor memory devices, memory systems including the same and methods of operating memory systems.

In general, a volatile memory device, such as a dynamic random access memory (DRAM), requires a refresh operation to maintain stored data. Therefore, a memory controller periodically provides refresh commands to a volatile memory device to refresh the memory device in a normal access mode.

However, as a density of a memory device increases, the refresh commands consume more power and decrease the efficiency of a command bus.

SUMMARY

Some example embodiments may provide a semiconductor memory device, capable of enhancing performance.

Some example embodiments may provide a memory system including the semiconductor memory device.

Some example embodiments may provide a method of operating a memory system including at least one semiconductor memory device and a memory controller, capable of enhancing performance.

According to example embodiments, a semiconductor memory device includes a memory cell array and a refresh control circuit. The memory cell array includes a plurality of memory cell rows. The refresh control circuit performs a normal refresh operation on the plurality of memory cell rows and performs a weak refresh operation on a plurality of weak pages of the plurality of memory cell rows. Each of the weak pages includes at least one weak cell whose data retention time is smaller than normal cells. The refresh control circuit transmits a refresh flag signal to a memory controller external to the semiconductor memory device when the refresh control circuit performs the weak refresh operation on the weak pages in a normal access mode.

In example embodiments, the refresh control circuit may maintain the refresh flag signal at a first logic level while the refresh control circuit performs the weak refresh operation on the weak pages in the normal access mode.

In example embodiments, the refresh control circuit may perform the weak refresh operation on the weak pages in parallel with the normal refresh operation on the memory cell rows when the refresh control circuit performs the normal refresh operation on the memory cell rows in response to a command from the memory controller.

While the refresh control circuit performs the normal refresh operation on a first memory cell row, the refresh control circuit may simultaneously refresh a corresponding weak page. The corresponding weak page may have a page address which is the same as the page address of the first memory cell row except that the page address of the first memory cell row differs from the weak page address of the corresponding weak page by one bit.

The command from the memory controller may be one of an auto refresh command, a stand-by signal and a sleep mode signal.

In example embodiments, the memory cell array may be a three dimensional memory cell array. The refresh control circuit may perform the weak refresh operation on the weak pages after the normal refresh operation on the memory cell rows is completed when the refresh control circuit performs the normal refresh operation on the memory cell rows in response to a command from the memory controller.

The refresh control circuit may decrease a refresh interval, may perform the normal refresh operation during a first interval in a refresh period defined in a specification of the semiconductor memory device, and may perform the weak refresh operation during a second interval successive to the first interval.

In example embodiments, the refresh control circuit may include a refresh clock generator, a refresh counter, a weak page address generator, an address comparing circuit, a control signal generator, an address converter and a refresh address output circuit. The refresh clock generator may generate a refresh clock signal in response to a first refresh control signal, a second refresh control signal and a mode signal. The refresh counter may generate counting address for sequentially refreshing the memory cell rows in response to the refresh clock signal, the refresh counter outputting a done signal upon generating a maximum counting address. The weak page address generator may stores weak page addresses of the weak pages, and the weak page address generator may output the weak page addresses in response to the refresh clock signal. The address comparing circuit may compare the counting address with each of the weak page addresses to output a first match signal and a second match signal. The control signal generator may generate a plurality of control signals based on the first refresh control signal, the second refresh control signal, the mode signal, the done signal, the first match signal and the second match signal. The address converter may generate a changed refresh row address by do-not-care processing at least one bit of the counting address, in response to a third control signal of the plurality of the control signals. The refresh address output circuit may output one of the counting address, the weak page address and the changed refresh row address as a refresh row address according to a refresh mode, based on a first control signal and a second control signal of the plurality of the control signals.

The refresh address output circuit may include a first multiplexer and a second multiplexer. The first multiplexer may select one of the counting address and the weak page address in response to the first control signal. The second multiplexer may select one of the changed refresh row address and an output of the first multiplexer to output the refresh row address in response to the second control signal.

The control signal generator may output the second control signal and the third control signal with a second logic level when the first refresh control signal indicates one of an auto refresh operation and a self refresh operation on the memory cell rows and the mode signal indicates a parallel mode of the weak refresh operation on the weak pages. Alternatively, the control signal generator may output the second control signal and the first controls signal with a first logic level and a second logic level respectively, and configured to transit the first control signal to a first logic level in response to the done signal transitioning to a first logic level when the first refresh control signal indicates one of an auto refresh operation and a self refresh operation on the memory cell rows and the mode signal indicates a sequential mode of the weak refresh operation on the weak pages.

The control signal generator may output the first control signal and the second control signal with a first logic level when the second refresh control signal indicates the weak refresh operation on the weak pages in the normal access mode. The refresh control circuit may further include a refresh flag circuit. The refresh flag circuit may receive the second refresh control signal, may maintain the refresh flag signal at the first logic level during the second refresh control signal at the first logic level and may transmit the refresh flag signal with a first logic level to the memory controller via a refresh pin.

According to example embodiments, a memory system includes at least one semiconductor memory device and a memory controller that controls the at least one semiconductor memory device. The at least one semiconductor memory device includes a memory cell array and a refresh control circuit. The memory cell array includes a plurality of memory cell rows. The refresh control circuit performs a normal refresh operation on the plurality of memory cell rows and performs a weak refresh operation on a plurality of weak pages of the plurality of memory cell rows. Each of the weak pages includes at least one weak cell whose data retention time is smaller than normal cells. The refresh control circuit transmits a refresh flag signal to the memory controller when the refresh control circuit performs the weak refresh operation on the weak pages in a normal access mode.

In example embodiments, the refresh control circuit may simultaneously transmit the refresh flag signal to the memory controller via a refresh pin while the refresh control circuit performs the weak refresh operation on the weak pages in the normal access mode. The memory controller may hold an access to the at least one semiconductor memory device during the refresh flag signal at a first logic level.

In example embodiments, the refresh control circuit may transmit the refresh flag signal to the memory controller via a refresh pin when the refresh control circuit is to perform the weak refresh operation on the weak pages in the normal access mode. The memory controller may transmit a permission signal in response to the refresh flag signal to the refresh control circuit through the refresh pin. The refresh control circuit may perform the weak refresh operation after the refresh control circuit receives the permission signal.

In example embodiments, the at least one semiconductor memory device may include first and second semiconductor memory devices that are commonly selected by one chip selection signal from the memory controller. A number of first weak pages of the first semiconductor memory device may be greater than a number of second weak pages of the second semiconductor memory device. The second semiconductor memory device may perform a second weak refresh operation on the second weak pages while the first semiconductor memory device performs a first weak refresh operation on the first weak pages in a normal access mode.

When the first semiconductor memory device performs the first weak refresh operation on the first weak pages, the first semiconductor memory device may output the refresh flag signal with a first logic level to a second refresh pin of the second semiconductor memory device and a third refresh pin of the memory controller via a first refresh pin of the first semiconductor memory device.

According to example embodiments, in a method of operating a memory system comprising at least one semiconductor memory device and a memory controller that controls the at least one semiconductor memory device, a refresh flag signal is transmitted, by the at least one semiconductor memory device, to the memory controller when the at least one semiconductor memory device performs a weak refresh operation on weak pages of a plurality of memory cell rows. Each of the weak pages includes at least one weak cell whose data retention time is smaller than normal cells. Access to the at least one semiconductor memory device is held by the memory controller during the refresh flag signal at a first logic level.

In example embodiments, the at least one semiconductor memory device may be accessed by the memory controller in response to the refresh flag signal transitioning to a second logic level.

In example embodiments, the at least one semiconductor memory device may perform the weak refresh operation on the weak pages in parallel with a normal refresh operation on the memory cell rows when the at least one semiconductor memory device performs the normal refresh operation on the memory cell rows in response to a command from the memory controller.

In example embodiments, the at least one semiconductor memory device may perform the weak refresh operation on the weak pages after a normal refresh operation on the memory cell rows is completed when the at least one semiconductor memory device performs the normal refresh operation on the memory cell rows in response to a command from the memory controller.

Accordingly, a semiconductor memory device including a control logic, a refresh control circuit and a memory cell array may enhancing performance by performing a weak refresh operation on weak pages in parallel with a normal refresh operation or sequentially after the normal refresh operation is completed. In addition, the refresh control circuit may hold a memory controller accessing the semiconductor memory device by transmitting a refresh flag signal to the memory controller when the refresh control circuit performs the weak refresh operation in the weak pages in a normal access mode.

BRIEF DESCRIPTION OF THE DRAWINGS

Example embodiments will be described below in more detail with reference to the accompanying drawings.

DETAILED DESCRIPTION

Figure 1:
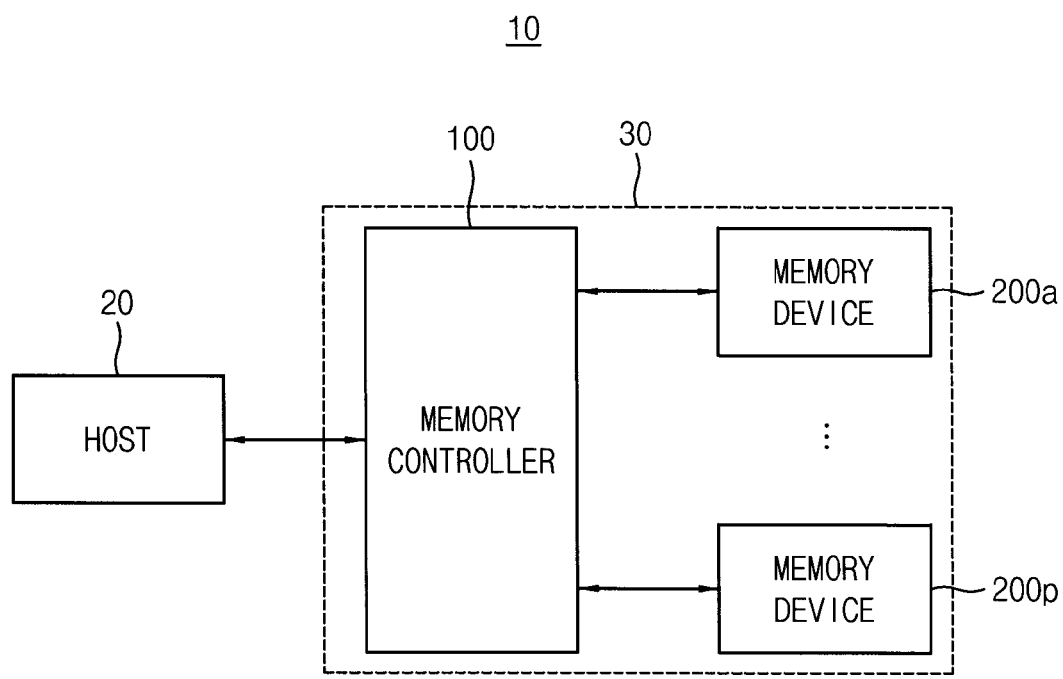
FIG. 1 is a block diagram illustrating an electronic system according to example embodiments.

Various example embodiments will be described more fully hereinafter with reference to the accompanying drawings, in which some example embodiments are shown. However, the present inventive concept maybe embodied in many different forms and should not be construed as limited to the example embodiments set forth herein. These example embodiments are just for disclosing of the inventive concept and many implementations and variations are possible that do not require the details provided herein. It should also be emphasized that the present inventive concept provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the scope of the present inventive concept. Like numerals refer to like elements throughout.

It will be understood that, although the terms first, second, third etc. may be used herein to describe various elements, these elements should not be limited by these terms. Unless the context indicates otherwise, these terms are only used to distinguish one element from another, for example as a naming convention. Thus, a first element discussed below in one part of the specification could be termed a second element in another part of the specification without departing from the teachings of the present inventive concept. In addition, in certain cases, even if a term is not described using "first," "second," etc., in the specification, it may still be referred to as "first" or "second" in a claim in order to distinguish different claimed elements from each other.

As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to example embodiments.

Referring to FIG. 1, an electronic system 10 may include a host 20 and a memory system 30. The memory system 30 may include a memory controller 100 and a plurality of semiconductor memory devices 200a~200p.

The host 20 may communicate with the memory system 30 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 20 may also communicate with the memory system 30 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 30. The memory controller 100 may control an overall data exchange between the host 20 and the plurality of semiconductor memory devices 200a~200p. For example, the memory controller 100 may write data in the plurality of semiconductor memory devices 200a~200p or read data from the plurality of semiconductor memory devices 200a~200p in response to request from the host 20.

In addition, the memory controller 100 may issue operation commands to the plurality of semiconductor memory devices 200a~200p for controlling the plurality of semiconductor memory devices 200a~200p.

In some embodiments, each of the plurality of semiconductor memory devices 200a~200p may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc.

As used herein, a semiconductor memory device may refer, for example, to a semiconductor chip having memory cells thereon (e.g., a memory chip formed on a die), a stack of semiconductor chips, at least one having memory cells thereon, a semiconductor package including one or more semiconductor memory chips stacked on a package substrate, or a package-on-package device including a plurality of packages. These devices may be formed using ball grid arrays, wire bonding, through substrate vias, or other electrical connection elements.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

Figure 2:
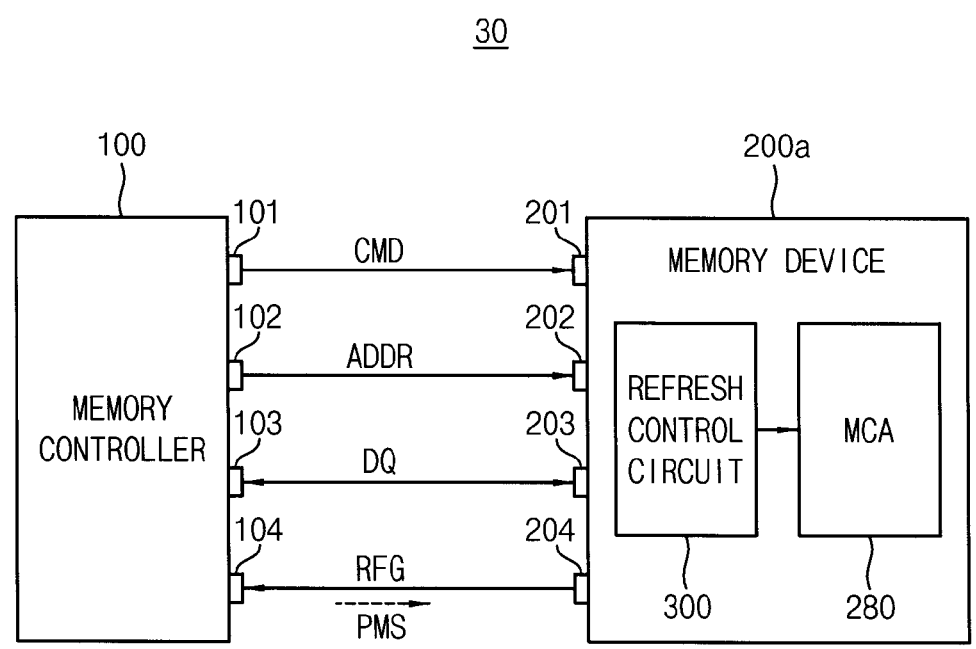
FIG. 2 is a block diagram illustrating the memory system shown in FIG. 1, according to one embodiment.

FIG. 2 is a block diagram illustrating the memory system shown in FIG. 1, according to one embodiment.

In FIG. 2, only one semiconductor memory device 200a in communication with the memory controller 100 is illustrated for convenience. However, the details discussed herein related to semiconductor memory device 200a may equally apply to the other semiconductor memory devices 200b~200p.

Referring to FIG. 2, the memory system 30 may include the memory controller 100 and the semiconductor memory device 200a. Each of the memory controller 100 and the semiconductor memory device 200a may be formed as a separate semiconductor chip or as a separate group of chips (e.g., semiconductor memory device 200a may a stack of semiconductor chips in a semiconductor package). The memory controller 100 and the semiconductor memory device 200a may be connected to each other through corresponding command pins 101 and 201, corresponding address pins 102 and 202, corresponding data pins 103 and 203 and corresponding refresh pins 104 and 204. The command pins 101 and 201 may transmit a command signal CMD through a command transmission line TL1, the address pins 102 and 202 may transmit an address signal ADDR through an address transmission line TL2, the data pins 103 and 203 may exchange data DQ through a data transmission line TL3, and the refresh pins 104 and 204 may transmit a refresh flag signal RFG through a transmission line TL4. In some embodiments, the memory controller 100 may transmit a permission signal PMS to the semiconductor memory device 100a through the refresh pins 104 and 204, in response to the refresh flag signal RFG.

Figure 3:
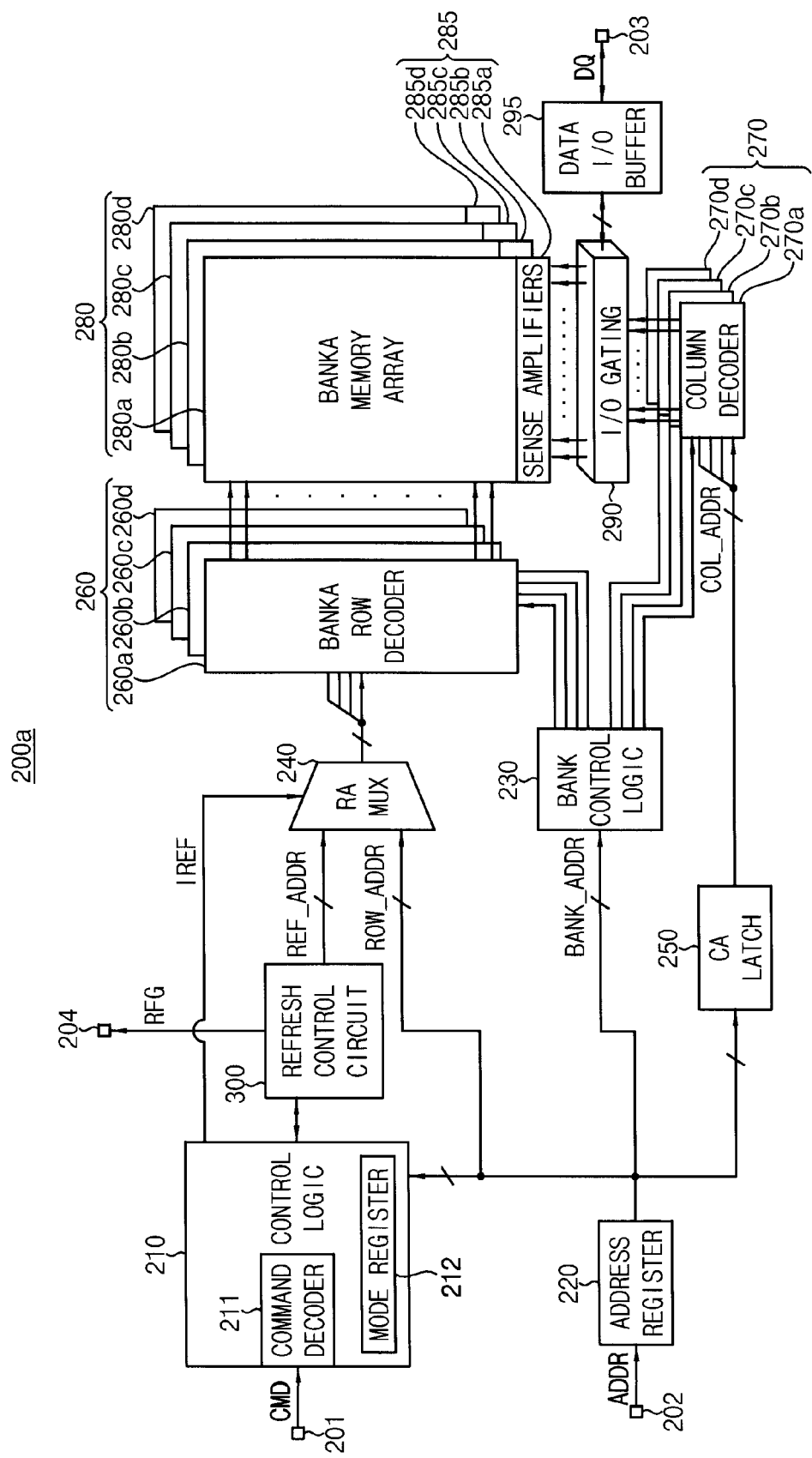
FIG. 3 is a block diagram illustrating the semiconductor memory device shown in FIG. 2, according to one embodiment.

FIG. 3 is a block diagram illustrating the semiconductor memory device shown in FIG. 2, according to one embodiment.

Referring to FIG. 3, the semiconductor memory device 200a may include a control logic 210, an address register 220, a bank control logic 230, a row address multiplexer 240, a column address latch 250, a row decoder 260, a column decoder 270, a memory cell array 280, a sense amplifier unit 285, an input/output (I/O) gating circuit 290, a data input/output (I/O) buffer 295, and a refresh control circuit 300.

The memory cell array 280 may include first through fourth bank arrays 280a, 280b, 280c and 280d. The row decoder 260 may include first through fourth bank column decoders 270a, 270b, 270c and 270d respectively coupled to the first through fourth bank arrays 280a, 280b, 280c and 280d, and the sense amplifier unit 285 may include first through fourth bank sense amplifiers 285a, 285b, 385c and 385d respectively coupled to the first through fourth bank arrays 280a, 280b, 280c and 280d. The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks. Although the semiconductor memory device 200a shown in FIG. 3 illustrates four banks, the semiconductor memory device 200a may include other number of banks.

The control logic 210 may control operations of the semiconductor memory device 200a. For example, the control logic 210 may generate control signals for the semiconductor memory device 200a to perform a write operation or a read operation. The control logic 210 may include a command decoder 211 that decodes the command signal CMD received from the memory controller 100 through the command pin 201 and a mode register 212 that is used to set an operation mode of the semiconductor memory device 200a. For example, the command decoder 211 may generate the control signals corresponding to the command signal CMD by decoding a write enable signal (/WE), a row address strobe signal (/RAS), a column address strobe signal (/CAS), a chip select signal (/CS), etc. The control logic 210 may further receive a clock signal (CLK) and a clock enable signal (/CKE) for operating the semiconductor memory device 200a in a synchronous manner.

The control logic 210 may control the refresh control circuit 300 such that the refresh control circuit 300 generates a refresh row address REF_ADDR. For example, the control logic 210 may control the refresh control circuit 300 such that the refresh control circuit 300 generates the refresh row address REF_ADDR in different ways according to which mode of an auto refresh mode, a self refresh mode and a normal operation mode the semiconductor memory device 200a is in. In addition, the refresh control circuit 300 may output an activated refresh signal IREF while performing the refresh operation and may output a deactivated refresh signal IREF after finishing the refresh operation. In addition, the refresh control circuit 300 may transmit to the memory controller 100 a refresh flag signal RFG with a first logic level through the refresh flag pin 204 when the refresh control circuit 300 performs a weak refresh operation on a weak pages of a plurality of memory cell rows in the memory cell array 280. Hereinafter, a first logic level may be a logic high level and a second logic level may be a logic low level. Each of the weak pages may include at least one weak cell whose data retention time is smaller than normal memory cells in the memory cell array 280. The memory controller 100 may hold an access to the semiconductor memory device 200a in response to the refresh flag signal RFG until the weak refresh operation is finished.

The address register 220 may receive an address ADDR including a bank address BANK_ADDR, a row address ROW_ADDR and a column address COL_ADDR from the memory controller 100 through the address pin 202. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the row address ROW_ADDR from the address register 220 and receive the refresh row address REF_ADDR from the refresh control circuit 300. The row address multiplexer 240 may output one of the row address ROW_ADDR and the refresh row address REF_ADDR in response to the refresh signal IREF received from the control logic 210. For example, the row address multiplexer 240 may output the refresh row address REF_ADDR when the refresh signal IREF is activated, and output the row address ROW_ADDR when the refresh signal IREF is deactivated. A row address output from the row address multiplexer 240 may be applied to the first through fourth bank row decoders 260a, 260b, 260c and 260d.

The activated one of the first through fourth bank row decoders 260a, 260b, 260c and 260d may decode the row address received from the row address multiplexer 240 and activate a word-line corresponding to the row address. For example, the activated bank row decoder may apply a word-line driving voltage to the word-line corresponding to the row address.

The column address latch 250 may receive the column address COL_ADDR from the address register 220 and temporarily store the received column address COL_ADDR. In some embodiments, in a burst mode, the column address latch 250 may generate column addresses that increment from the received column address COL_ADDR. The column address latch 250 may apply the temporarily stored or generated column address to the first through fourth bank column decoders 270a, 270b, 270c and 270d.

The activated one of the first through fourth bank column decoders 270a, 270b, 270c and 270d may decode the column address COL_ADDR received from the column address latch 250 and control the input/output gating circuit 290 to output data corresponding to the column address COL_ADDR.

The input/output gating circuit 290 may include a circuitry for gating input/output data. The input/output gating circuit 290 may further include an input data mask logic, read data latches for storing data received from the first through fourth bank arrays 280a, 280b, 280c and 280d, and write drivers for writing data to the first through fourth bank arrays 280a, 280b, 280c and 280d.

Data DQ read from one bank array of the first through fourth bank arrays 280a, 280b, 280c and 280d may be sensed by sense amplifiers coupled to the one bank array and be stored in the read data latches. The data DQ stored in the read data latches may be provided to the memory controller 100 via the data input/output buffer 295 and the data pin 203. Data DQ to be written to one bank array of the first through fourth bank arrays 280a, 280b, 280c and 280d may be provided from the memory controller 100 to the data input/output buffer 295 via the data pin 203. The data DQ provided to the data input/output buffer 295 may be written to the one bank array via the write drivers.

Figure 4:
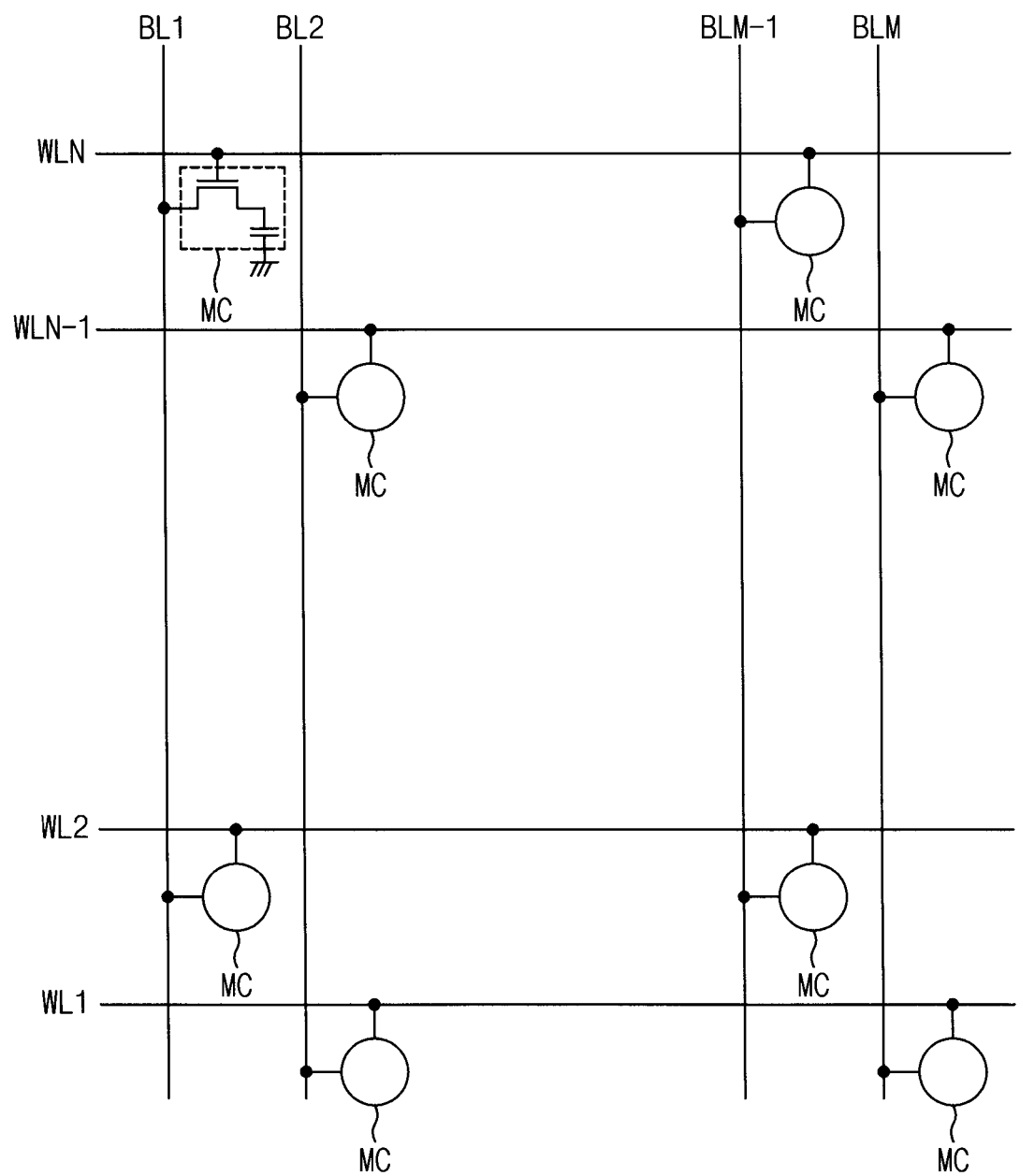
FIG. 4 illustrates a first bank array in the semiconductor memory device of FIG. 3, according to one embodiment.

FIG. 4 illustrates a first bank array in the semiconductor memory device of FIG. 3, according to one embodiment.

Referring to FIG. 4, the first bank array 280a may include a plurality of word-lines WL1~WLN (N is a natural number greater than two), a plurality of bit-lines BL1~BLM (M is a natural number greater than two), and a plurality of memory cells MCs disposed near intersections between the word-lines WL1~WLN and the bit-lines BL1~BLM. In one embodiment, each of the plurality of memory cells MCs may include a dynamic random access memory (DRAM) cell structure. The plurality of word-lines WL1~WLN to which the plurality of memory cells MCs are connected may be defined as rows of each of the bank arrays 280a~280d, and the plurality of bit-lines BL1~BLM to which the plurality of memory cells MCs are connected may be defined as columns of each of the bank arrays 280a~280d.

Figure 5:
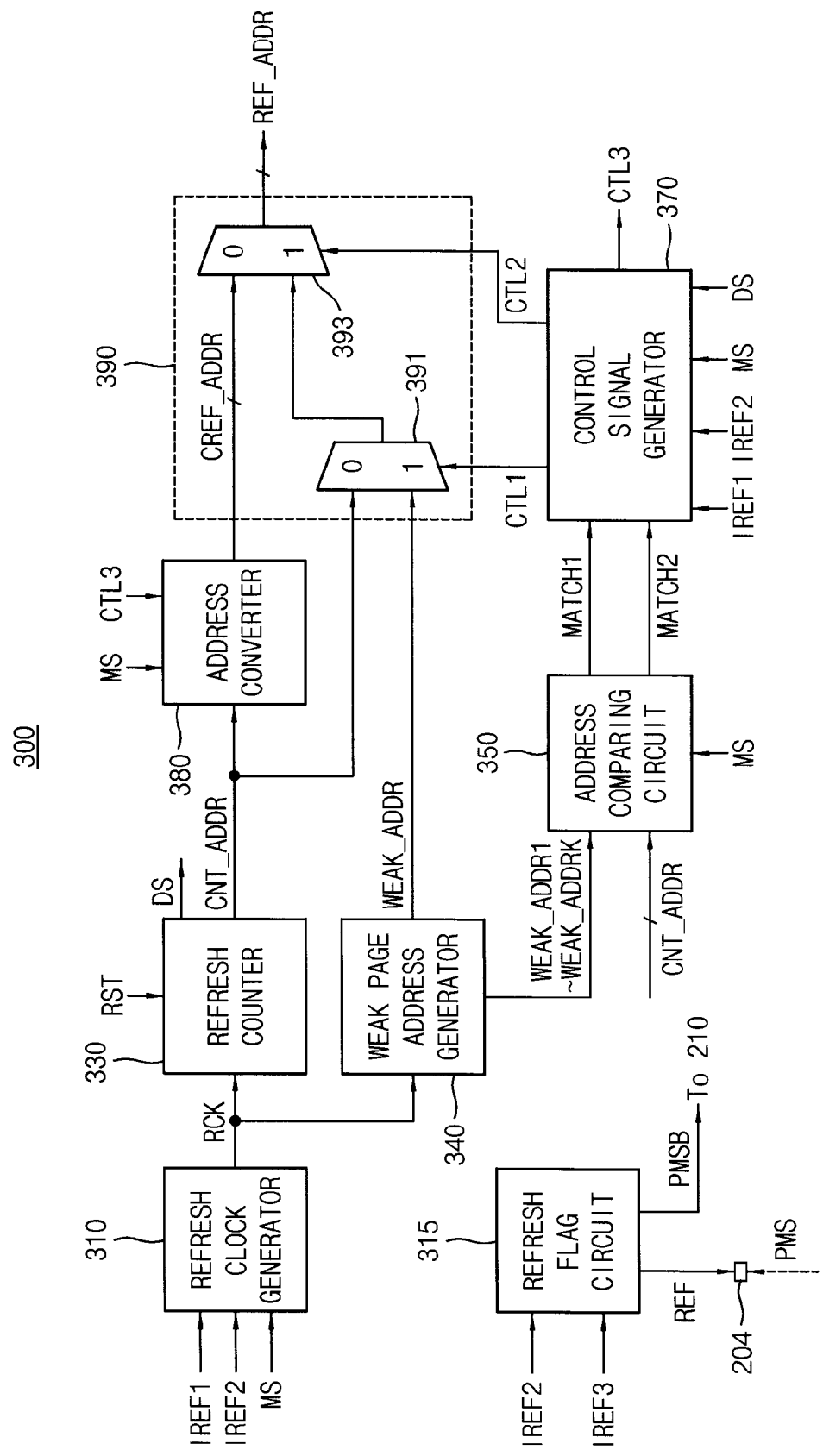
FIG. 5 is a block diagram illustrating the refresh control circuit in the semiconductor memory device of FIG. 3, according to one embodiment.

FIG. 5 is a block diagram illustrating the refresh control circuit in the semiconductor memory device of FIG. 3, according to one embodiment.

Referring to FIG. 5, a refresh control circuit 300 may include a refresh clock generator 310, a refresh counter 330, a weak page address generator 340, an address comparing circuit 350, a control signal generator 370, an address converter 380, a refresh address output circuit 390 and a refresh flag circuit 315.

The refresh clock generator 310 may generate a refresh clock signal RCK in response to a first refresh control signal IREF1, a second refresh control signal IREF2 and a mode signal MS. The control logic 210 may generate the first refresh control signal IREF1, the second refresh control signal IREF2 and the mode signal MS based on a command or a signal from the memory controller 100. The first refresh control signal IREF1 may direct an auto refresh mode or a self refresh mode based on the command from the memory controller 100. In the auto refresh mode, the refresh control circuit 300 may perform a normal refresh operation on the memory cell rows in the memory cell array 280 in response to a refresh command from the memory controller 100. In the self refresh mode, the refresh control circuit 300 may perform the normal refresh operation on the memory cell rows in the memory cell array 280 in response to stand-by signal or a sleep mode signal from the memory controller 100.

The second refresh control signal IREF2 may direct an immediate weak refresh operation, which is performed only on the weak pages in the memory cell array 280. The control logic 210 may provide the first refresh control signal IREF1 and the second refresh control signal IREF2 to the refresh control circuit 300.

In addition, the mode signal MS may direct whether the weak refresh operation on the weak pages is performed in parallel with the normal refresh operation or sequentially after the normal refresh operation in the auto refresh mode or the self refresh mode. For example, when the mode signal MS has a first logic level, the refresh control circuit 300 may perform the weak refresh operation in parallel with the normal refresh operation (parallel refresh mode). When the mode signal MS has a second logic level (logic low level), the refresh control circuit 300 may perform the weak refresh operation after the normal refresh operation is completed (sequential refresh mode). The mode register 212 may provide the mode signal MS to the refresh control circuit 300.

The refresh clock generator 310 may change a period of the refresh clock signal RCK in response to the first refresh control signal IREF1, the second refresh control signal IREF2 and the mode signal MS. For example, when the first refresh control signal IREF1 indicates the auto refresh mode or the self refresh mode and the mode signal MS indicates the sequential refresh mode, the refresh clock generator 310 may decrease a period of the refresh clock signal RCK. When the period of the refresh clock signal RCK is decreased, a refresh interval (tREF1) is also decreased. Therefore, the refresh control circuit 300 may perform the normal refresh operation and the weak refresh operation sequentially within a refresh period (tREF) defined in the specification of the semiconductor memory device 200*a*. The weak pages are refreshed at least twice during the refresh period.

The refresh counter 330 may generate a counting address CNT_ADDR designating respective memory cell rows by performing counting operation at the period of the refresh clock signal RCK. The refresh counter 330 may output a done signal DS upon the refresh counter 330 outputting the maximum value of the counting address CNT_ADDR. The control logic 210 may provide a reset signal RST to the refresh counter 330 during a power-up sequence and the refresh counter 330 may be reset to initialize the value of counting address CNT_ADDR in response to the reset signal RST.

The weak page address generator 340 may store weak page addresses of the weak pages and may output a weak page address WEAK_ADDR.

The address comparing circuit 350 is enabled when the mode signal MS has a first logic level (when the mode signal MS indicates the parallel refresh mode) and may compare each of the weak page addresses WEAK_ADDR1~WEAK_ADDRK (K is a natural number greater than one) with the counting address CNT_ADDR to provide a first match signal MATCH1 and the second match signal MATCH2. When each bit of the counting address CNT_ADDR matches with each bit of one of the weak page addresses WEAK_ADDR1~WEAK_ADDRK, each of the first and second match signals MATCH1 and MATCH2 has a first logic level. When each bit of the counting address CNT_ADDR matches with each bit of one of the weak page addresses WEAK_ADDR1~WEAK_ADDRK except at least one bit such as most significant bit (MSB), the first match signal MATCH1 has a second logic level and the second match signal MATCH2 has a first logic level.

The control signal generator 370 may generate a plurality of control signals CTL1, CTL2 and CTL3 based on the first refresh control signal IREF1, the second refresh control signal IREF2, the mode signal MS and the done signal DS. The control signal generator 370 may output the first control signal CTL1 and the second control signal CTL2 to the refresh address output circuit 390 and may output the third control signal CTL3 to the address converter 380.

When the first refresh control signal IREF1 indicates one of the auto refresh operation and the self refresh operation on the memory cell rows and the mode signal MS indicates the parallel refresh mode of the weak refresh operation, the control signal generator 370 may output the second control signal CTL2 and the third control signal CTL3 with a second logic level. When the first refresh control signal IREF1 indicates one of the auto refresh operation and the self refresh operation on the memory cell rows and the mode signal MS indicates the sequential refresh mode of the weak refresh operation, the control signal generator 370 may output the second control signal CTL2 with a first logic level and may output the first control signal CTL1 with a second logic level to transit the first control signal CTL to a first logic level in response to the done signal DS transitioning to a first logic level. When the second refresh control signal IREF2 indicates the weak refresh operation on the weak pages in the normal access mode, the control signal generator 370 may output the first control signal CTL1 and the second control signal CTL2 with a first logic level.

The address converter 380 is activated when the mode signal MS indicates the parallel refresh mode, and may do-not-care processing on at least one bit of the counting address CNT_ADDR such as MSB of the counting address CNT_ADDR in response to the third control signal CTL3 to output a changed refresh row address CREF_ADDR. When the changed refresh row address CREF_ADDR is output as a refresh row address REF_ADDR, two memory cell rows corresponding to two page addresses whose MSB are different from each other are simultaneously enabled. The two memory cell rows corresponding to two page addresses whose MSB are different from each other belong to different memory blocks in the memory cell array 280 which do not share a sense amplifier.

The refresh address output circuit 390 may include a first multiplexer 391 and a second multiplexer 393. The first multiplexer 391 may select one of the counting address CNT_ADDR and the weak page address WEAK_ADDR in response to the first control signal CTL1. The second multiplexer 393 may select one of the changed refresh row address CREF_ADDR and an output of the first multiplexer 391 to output the refresh row address REF_ADDR in response to the second control signal CTL2.

The refresh flag circuit 315 may transmit to the memory controller 100 a refresh flag signal RFG maintaining a first logic level through the refresh pin 204 while the weak refresh operation is performed on the weak pages when the refresh flag circuit 315 receives the second refresh control signal ICTL2 indicating an immediate weak refresh operation on the weak pages in the normal access mode. In addition, the refresh flag circuit 315 may transmit to the memory controller 100 a refresh flag signal RFG having a short pulse type through the refresh pin 204 when the refresh flag circuit 315 receives the third refresh control signal ICTL3 indicating a conditional weak refresh operation that requires a permission of the memory controller 100 in the normal access mode. In addition, the refresh flag circuit 315 may receive a permission signal PMS from the memory controller 100 and may transmit an inverted permission signal PMSB to the control logic in response to the permission signal PMS.

Figure 6:
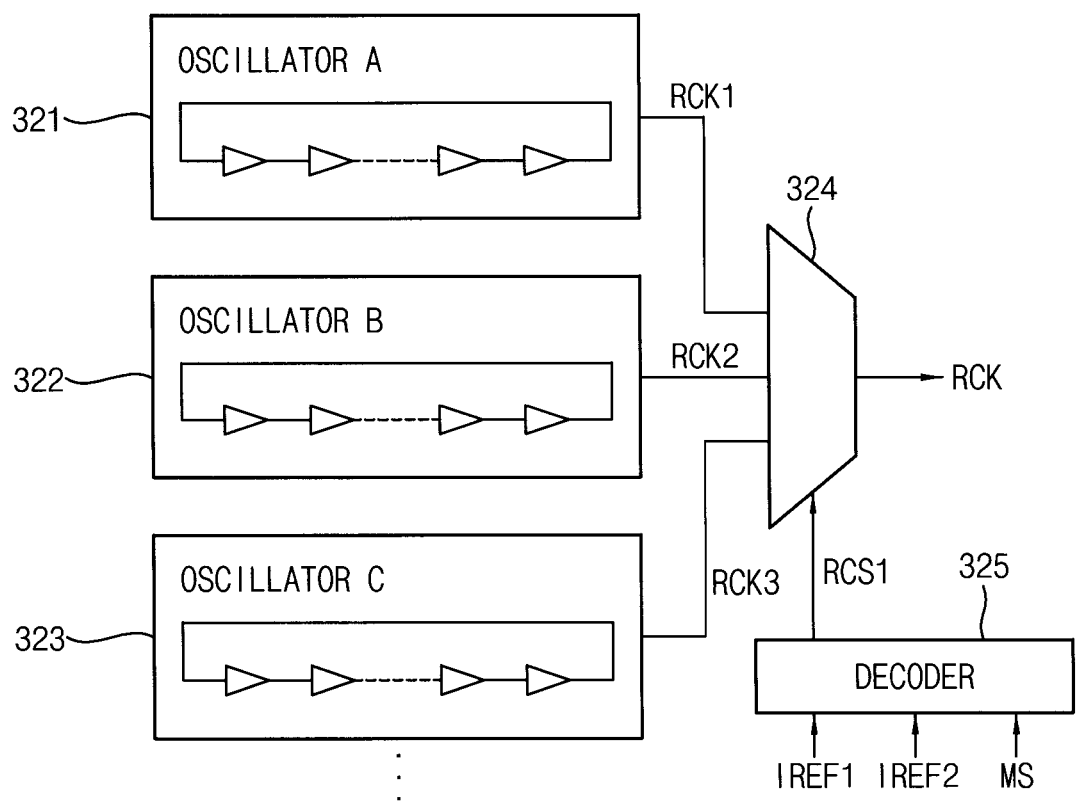
FIG. 6 is a circuit diagram illustrating the refresh clock generator shown in FIG. 5, according to one embodiment.

FIG. 6 is a circuit diagram illustrating the refresh clock generator shown in FIG. 5, according to one embodiment.

Referring to FIG. 6, a refresh clock generator 310*a* may include a plurality of oscillators 321, 322 and 323, a multiplexer 324 and a decoder 325. The decoder 325 may decode the first refresh control signal ICTL1, the second refresh control signal ICTL2 and the mode signal MS to output a clock control signal RCS1. The oscillators 321, 322, and 323 generate refresh clock signals RCK1, RCK2 and RCK3 having different periods. The multiplexer 314 selects one of the refresh clock signals RCK1, RCK2 and RCK3 to provide the refresh clock signal RCK in response to the clock control signal RCS1.

Figure 7:
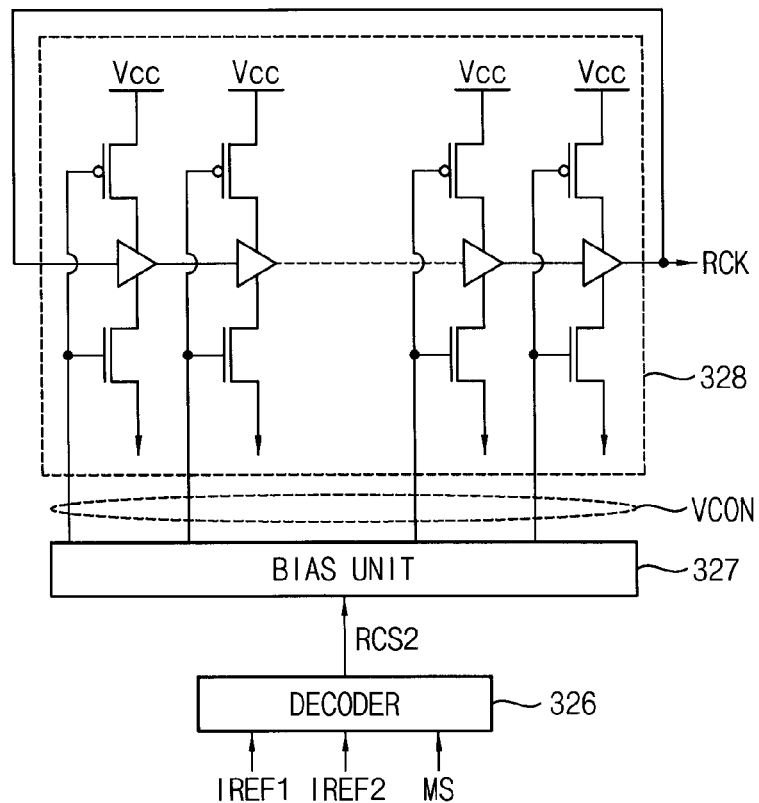
FIG. 7 is a circuit diagram illustrating the refresh clock generator shown in FIG. 5, according to one embodiment.

FIG. 7 is a circuit diagram illustrating an example of the refresh clock generator in FIG. 5 according to example embodiments.

Referring to FIG. 7, a refresh clock generator 310b may include a decoder 326, a bias unit 327 and an oscillator 328. The decoder 326 may decode the first refresh control signal ICTL1, the second refresh control signal ICTL2 and the mode signal MS to output a clock control signal RCS2. The bias unit 327 generates a control voltage VCON in response to the clock control signal RCS2. The oscillator 328 generates the refresh pulse signal RCK having a variable period, according to the control voltage VCON.

Figure 8:
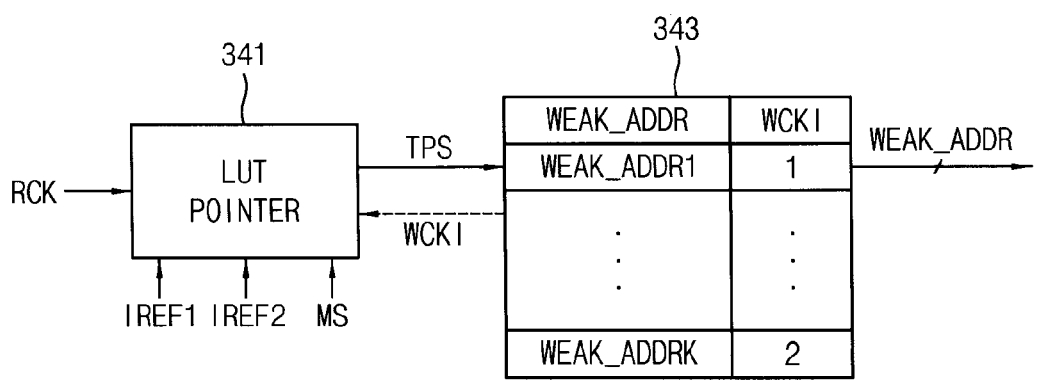
FIG. 8 illustrates the weak address generator in the refresh control circuit of FIG. 5, according to one embodiment.

FIG. 8 illustrates the weak address generator in the refresh control circuit of FIG. 5, according to one embodiment.

Referring to FIG. 8, the weak address generator 340 may include a look-up table (LUT) pointer 341 and an LUT 343.

The LUT pointer 341 generates a table pointing signal TPS indicating gradually increasing table addresses of the LUT 343 in synchronization with the refresh clock signal RCK and delays providing the table pointing signal TPS to the LUT 343 by wait clocks indicated by the wait clock information WCKI. The LUT pointer 341 provides the table pointing signal TPS to the LUT 343. The LUT 343 may store the weak addresses WEAK_ADDR1~WEAK_ADDRK of the memory cell row 280 according to order as the addresses increase. The LUT 343 may store the wait clock information WCKI for designating output timing of the weak address WEAK_ADDR.

The LUT pointer 341 may delay providing the table pointing signal TPS to the LUT 343 by wait clocks indicated by the wait clock information WCKI or output the table pointing signal TPS to the LUT 343 in synchronization with the refresh clock signal RCK according to a refresh mode based on the first refresh control signal IREF1, the second refresh control signal IREF2 and the mode signal MS. For example, when the mode signal MS indicates the parallel refresh mode, the LUT pointer 341 may delay providing the table pointing signal TPS to the LUT 343 by wait clocks indicated by the wait clock information WCKI. For example, when the mode signal MS indicates the sequential refresh mode, or the second refresh control signal IREF2 indicates the weak refresh operation, the LUT pointer 341 may output the table pointing signal TPS to the LUT 343 in synchronization with the refresh clock signal RCK without regard to the wait clock information WCKI.

Figure 9:
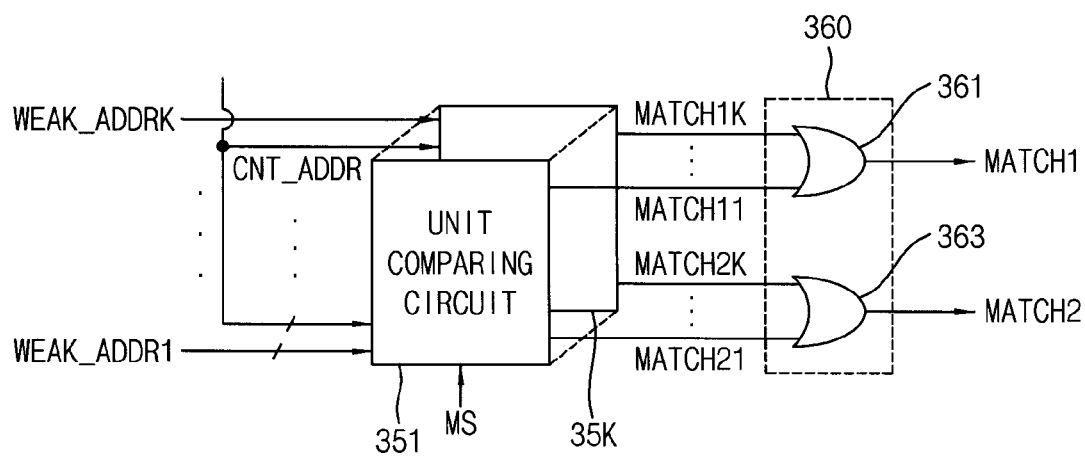
FIG. 9 illustrates the address comparing circuit in the refresh control circuit of FIG. 5, according to one embodiment.

FIG. 9 illustrates the address comparing circuit shown in the refresh control circuit of FIG. 5, according to one embodiment.

Referring to FIG. 9, the address comparing circuit 350 may include a plurality of unit comparing circuits 351~35K and an operation unit 360.

Each of the unit comparing circuits 351-35K may compare each of the weak page addresses WEAK_ADDR1~WEAK_ADDRK and the counting address CNT_ADDR to provide a plurality of first match signals MATCH11~MATCH1K and compare each of abbreviated weak page addresses and an abbreviated counting address to provide a plurality of second match signals MATCH21~MATCH2K. Each of the abbreviated weak page addresses may be obtained by omitting at least one bit such as an MSB of each of the weak page addresses WEAK_ADDR1~WEAK_ADDRK and the abbreviated counting address may be obtained by omitting an MSB of the counting address CNT_ADDR.

The operation unit 360 provides the first match signal MATCH1 and the second match signal MATCH2 based on the first match signals MATCH11~MATCH1K and the second match signals MATCH21~MATCH2K respectively. The operation unit 360 may include OR gates 361 and 363. The OR gates 361 performs a logical OR operation on the first match signals MATCH11~MATCH1K to provide the first match signal MATCH1 and the OR gate 363 performs a logical OR operation on the second intermediate match signals MATCH21~MATCH2K to provide the second match signal MATCH2.

Therefore, when at least one of the weak page addresses WEAK_ADDR1~WEAK_ADDRK matches with the counting address CNT_ADDR, the first match signal MATCH1 is a first logic level. In addition, when at least one of the abbreviated weak page addresses matches with the abbreviated counting address, the second match signal MATCH2 is a first logic level. For example, when at least one of the weak page addresses WEAK_ADDR1~WEAK_ADDRK matches with the counting address CNT_ADDR in every bit, the first and second match signals MATCH1 and MATCH2 are first logic level. When each address bit of at least one of the weak page addresses WEAK_ADDR1~WEAK_ADDRK matches with each address bit of the counting address CNT_ADDR except at least one bit such as most significant bit MSB, the first match signal MATCH1 is a second logic level and the second match signal MATCH2 is a first logic level.

Figure 10:
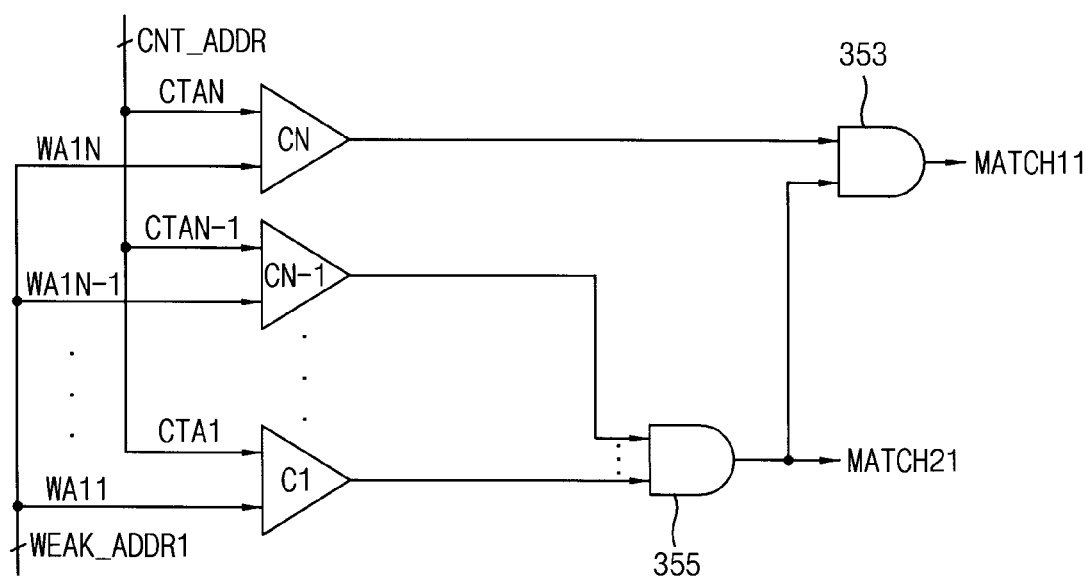
FIG. 10 illustrates one of the unit comparing circuits in FIG. 9, according to one embodiment.

FIG. 10 illustrates one of the unit comparing circuits shown in FIG. 9, according to one embodiment.

In FIG. 10, a configuration of the first unit comparing circuit 351 of the unit comparing circuit 351-35K in FIG. 9 is illustrated.

Referring to FIG. 10, the first unit comparing circuit 351 may include a plurality of comparators C1~CN and AND gates 353 and 355. The comparators C1~CN compares bits WA11~WA1N of the first weak page address WEAK_ADDR1 and bits CTA1~CTAN of the counting address CNT_ADDR respectively. The AND gate 355 performs logical AND operation on outputs of the comparators C1~CN−1 except output of the comparator CN that compares MSBs of the weak page address WEAK_ADDR1 and the counting address CNT_ADDR to provide the second match signal MATCH21. The AND gate 353 performs logical AND operation on outputs of the AND gate 335 and the comparator CN to provide the first match signal MATCH11. Therefore, the first match signal MATCH11 is a first logic high level when each bit WA11~WA1N of the first weak page address WEAK_ADDR1 matches with corresponding bit CTA1~CTAN of the counting address CNT_ADDR. In addition, the second match signal MATCH21 is a first level when each bit WA11~WA1N−1 of the first weak page address WEAK_ADDR1 except MSB matches with corresponding bit CTA1~CTAN−1 of the counting address CNT_ADDR except MSB. Thus, when the first match signal MATCH11 is a second logic level and the second match signal MATCH21 is a first logic level, the MSB of the counting address CNT_ADDR is different from the MSB of the first weak page address WEAK_ADDR1.

Figure 11:
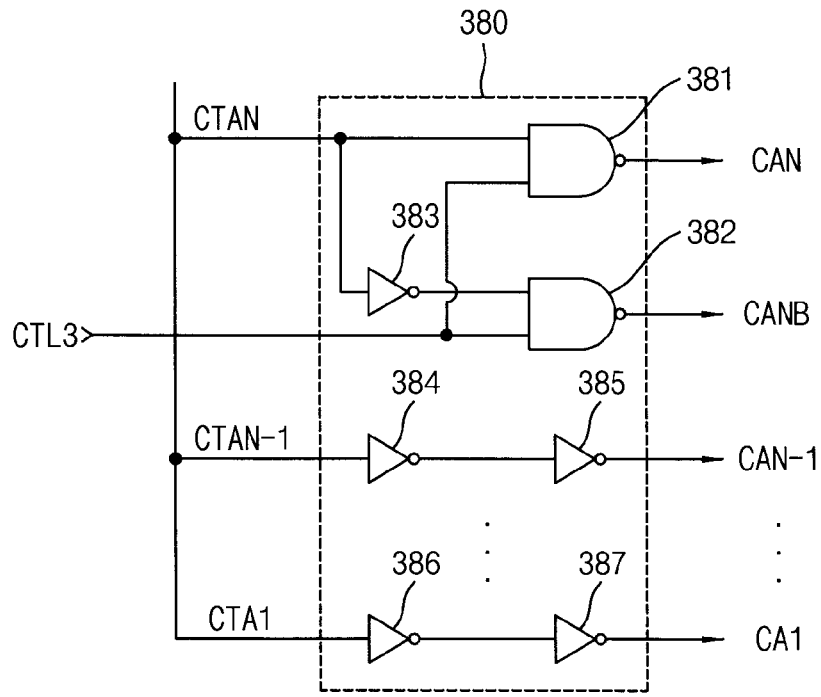
FIG. 11 illustrates the address converter in the refresh control circuit of FIG. 5, according to one embodiment.

FIG. 11 illustrates the address converter in the refresh control circuit of FIG. 5 according to example embodiments.

Referring to FIG. 11, the address converter 380 may include NAND gates 381 and 382, an inverter 383, inverters 384 and 385 and inverters 386 and 387. The NAND gate 381 performs a logical NAND operation on MSB CTAN of the counting address CNT_ADDR and the third control signal CTL3 to output an MSB CAN of the changed refresh row address CREF_ADDR. The inverter 383 inverts the MSB CTAN of the counting address CNT_ADDR, and the NAND gate 381 performs a logical NAND operation on an output of the inverter 383 and the third control signal CTL3 to output an inverted version CANB of the MSB CAN of the changed refresh row address CREF_ADDR. The inverters 384 and 385 buffer a bit CTAN−1 of the counting address CNT_ADDR to output a bit CAN−1 of the changed refresh row address CREF_ADDR. The inverters 384 and 385 buffer a first bit CTAT of the counting address CNT_ADDR to output a first bit CA1 of the changed refresh row address CREF_ADDR.

When the third control signal CTL3 has a second logic level, the NAND gates 381 and 382 may provide complementary outputs CAN and CANB having same logic levels without regard to a logic level of the MSB CTAN of the counting address CNT_ADDR. That is, when the MSB of the counting address CNT_ADDR CTAN is do-not-care processed, two memory cell rows may be selected from bits of the changed refresh row address CREF_ADDR except the MSB of the changed refresh row address CREF_ADDR. Therefore, when third control signal CTL3 has a second logic level, two memory cell rows may be simultaneously refreshed by one refresh row address REF_ADDR.

Figure 12:
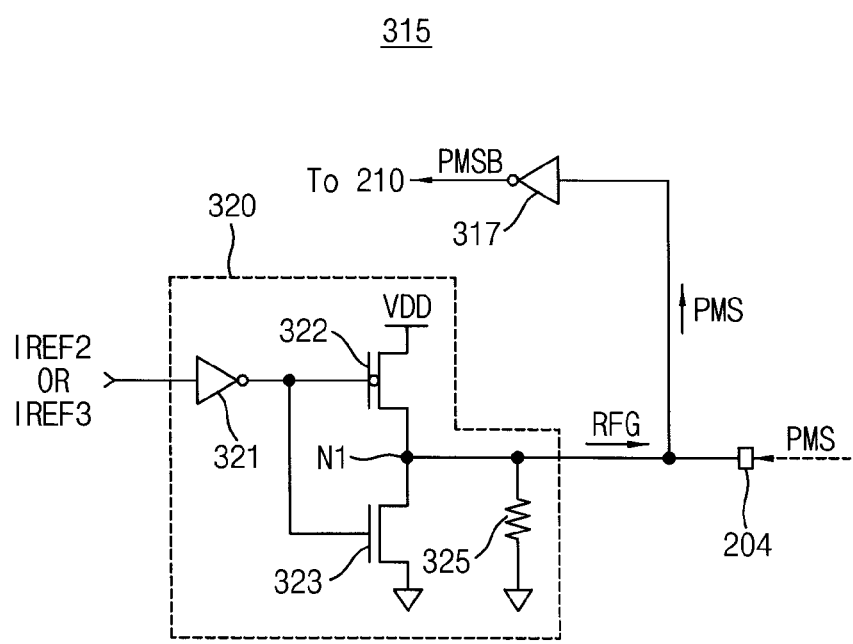
FIG. 12 illustrates the refresh flag circuit in the refresh control circuit of FIG. 5, according to one embodiment.

FIG. 12 illustrates the refresh flag circuit shown in the refresh control circuit of FIG. 5, according to one embodiment.

Referring to FIG. 12, the refresh flag circuit 315 may include an inverter 317 and a flag generator 320. The flag generator 320 may include an inverter 321, a p-channel metal-oxide semiconductor (PMOS) transistor 322, an n-channel metal-oxide semiconductor (NMOS) transistor 323 and a resistor 325.

The PMOS transistor 322 may be connected between a power supply voltage VDD and a first node N1 connected to the refresh pin 204, and the NMOS transistor 323 may be connected between the first node N1 and a ground voltage. The inverter 321 may be commonly connected to gates of the PMOS transistor 322 and the NMOS transistor 323. That is, the PMOS transistor 322 and the NMOS transistor 323 may constitute another inverter. The inverter 317 may be connected to the first node N1.

The inverter 321 inverts the pulse-typed second refresh control signal IREF2 indicating the immediate weak refresh operation on the weak pages, the PMOS transistor 322 and the NMOS transistor 323 inverts an output of the inverter 321 to transmit the refresh flag signal RFG to the memory controller 100 through the refresh pin 204. The refresh flag signal RFG may be maintained at a first logic level while the weak refresh operation is performed on the weak pages in the normal access mode of the semiconductor memory device 200a. The memory controller 100 holds an access to the semiconductor memory device 200a during the refresh flag signal RFG being at a first logic level, and the memory controller 100 may access the semiconductor memory device 200a after the refresh flag signal RFG transits to a second logic level.

The inverter 321 inverts the short pulse-typed third refresh control signal IREF3 indicating the conditional weak refresh operation on the weak pages, the PMOS transistor 322 and the NMOS transistor 323 inverts an output of the inverter 321 to transmit the refresh flag signal RFG to the memory controller 100 through the refresh pin 204. The memory controller 100 may provide the refresh pin 204 with the permission signal PMS allowing the conditional weak refresh operation, in response to the short pulse-typed third refresh control signal IREF3. The permission signal PMS may be provided to the inverter 317 through the refresh pin 204. The inverter 317 inverts the permission signal PMS to provide an inverted permission signal PMSB to the control logic 210 in FIG. 3 and the control logic 210 may output the second refresh control signal IREF2 to the refresh control circuit 300 in response to the inverted permission signal PMSB. The refresh control circuit 300 performs the weak refresh operation on the weak pages in response to the second refresh control signal IREF2.

Figure 13:
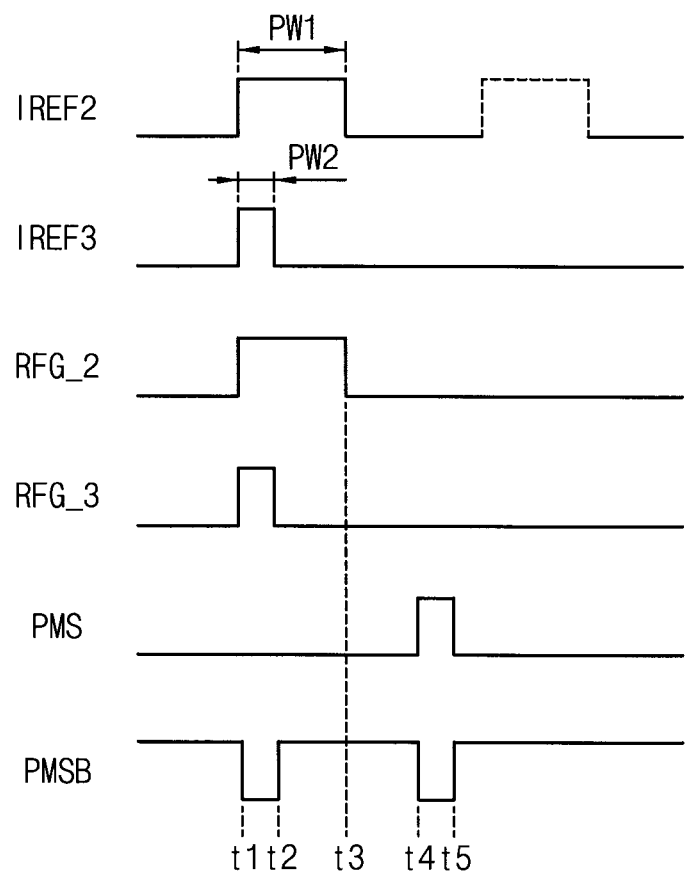
FIG. 13 is a timing diagram illustrating operation of the refresh flag circuit of FIG. 12, according to one embodiment.

FIG. 13 is a timing diagram illustrating operation of the refresh flag circuit of FIG. 12, according to one embodiment.

Referring to FIGS. 12 and 13, the second refresh control signal IREF2 may have a first pulse width PW1 which is maintained at a first logic level during the weak refresh operation being performed on the weak pages, and the third refresh control signal IREF3 may have a second pulse width PW2 smaller than the first pulse width PW1. Therefore, a refresh flag signal RFG_2 driven by the second refresh control signal IREF2 may have the first pulse width PW1 and a refresh flag signal RFG_3 driven by the first refresh control signal IREF3 may have the second pulse width PW2.

There will next be a description on a case when the immediate weak refresh operation is performed on the weak pages according to the second refresh control signal IREF2.

When the second refresh control signal IREF2 is a first logic level between times t1 and t3, the refresh flag signal RFG_2 is a first logic level between times t1 and t3. Therefore, the refresh control signal 300 performs the weak refresh operation on the weak pages between times t1 and t3, and the memory controller 100 holds an access to the semiconductor memory device 200a between times t1 and t3.

There will next be a description on the case when the conditional weak refresh operation is performed on the weak pages according to the third refresh control signal IREF3.

When the third refresh control signal IREF3 is a first logic level between times t1 and t2, the refresh flag signal RFG_3 is a first logic level between times t1 and t2. The inverted permission signal PMSB is a second logic level between times t1 and t2 due to the refresh flag signal RFG_3. The memory controller 100 transmits to the inverter 317 the permission signal PMS which is maintained at a first logic level between times t4 and t5 through the refresh pin 204, in response to the refresh flag signal RFG_3. The inverter 317 inverts the permission signal PMS to provide the control logic 210 with the inverted permission signal PMSB which is maintained at a second logic level between times t4 and t5. The control logic 210 provides the second refresh control signal IREF2 to the refresh control circuit 300. Therefore, the refresh control circuit 300 may perform the weak refresh operation on the weak pages after time t5.

Figure 14:
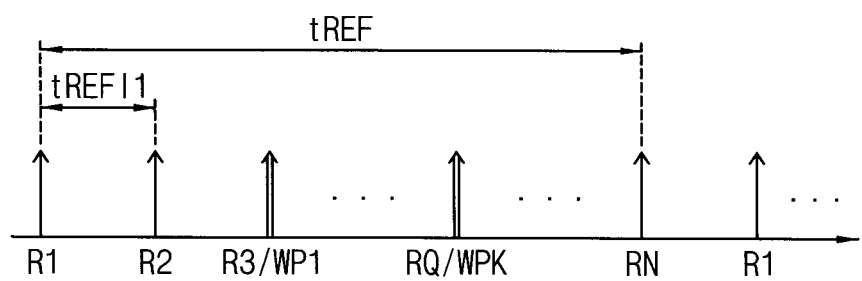
FIG. 14 illustrates that the normal refresh operation and the weak refresh operation are performed in parallel in the semiconductor memory device of FIG. 3, according to one embodiment.

FIG. 14 illustrates that the normal refresh operation and the weak refresh operation are performed in parallel in the semiconductor memory device of FIG. 3, according to one embodiment.

Referring to FIG. 14, when the auto refresh operation or the self refresh operation is performed on the memory cell row in response to an auto refresh command, the sleep mode signal or the stand-by signal, the weak refresh operation on the weak pages is performed in parallel with the normal refresh operation. Memory cell rows corresponding to row addresses R1~RN are sequentially refreshed. When the memory cell row corresponding to the row address R3 is refreshed, a weak page corresponding to a weak page address WP1 different from the row address R3 in the MSB is simultaneously refreshed. In addition, when the memory cell row corresponding to the row address RQ (Q is a natural number greater than 3 and smaller than N) is refreshed, a weak page corresponding to a weak page address WPK different from the row address RQ only in the MSB is simultaneously refreshed. FIG. 14 illustrates a case when the first refresh control signal IRFF1 indicates the normal refresh operation and the mode signal MS indicates the parallel refresh mode in the refresh control circuit 300 of FIG. 5. The LUT pointer 341 in FIG. 8 may delay providing the table pointing signal TPS to the LUT 343 by wait clocks indicated by the wait clock information WCKI. The memory cell rows corresponding to the row addresses R1~RN may be sequentially refreshed according to a first refresh interval (tIREFI1) within the refresh period (tREF).

Figure 15:
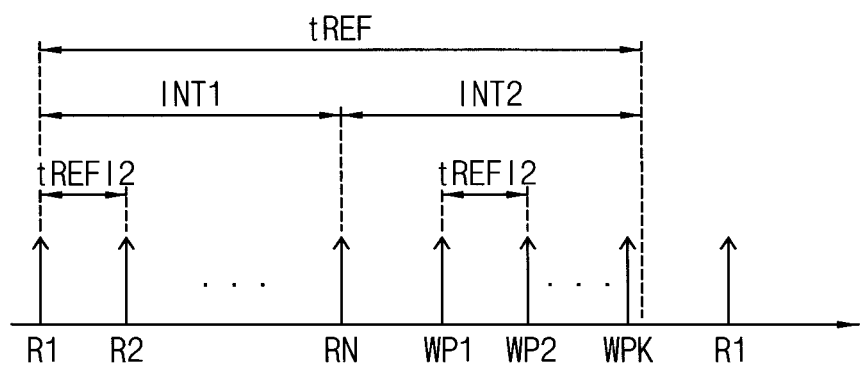
FIG. 15 illustrates that the normal refresh operation and the weak refresh operation are sequentially performed in the semiconductor memory device of FIG. 3, according to one embodiment.

FIG. 15 illustrates that the normal refresh operation and the weak refresh operation are sequentially performed in the semiconductor memory device of FIG. 3, according to one embodiment.

Referring to FIG. 15, when the auto refresh operation or the self refresh operation is performed on the memory cell row in response to an auto refresh command, the sleep mode signal or the stand-by signal, the weak refresh operation on the weak pages is performed after the normal refresh operation. Memory cell rows corresponding to row addresses R1~RN are sequentially refreshed according to a second refresh interval (tREFI2) during a first interval INT1 within the refresh period (tREF) and the weak pages WP1~WPK are sequentially refreshed according to the second refresh interval (tREFI2) during a second interval INT2 within the refresh period (tREF). FIG. 15 illustrates a case when the first refresh control signal IRFF1 indicates the normal refresh operation and the mode signal MS indicates the sequential refresh mode in the refresh control circuit 300 of FIG. 5. The LUT pointer 341 in FIG. 8 may provide the table pointing signal TPS to the LUT 343 in synchronization with the refresh clock signal RCK without regard to the wait clock information WCKI. In the case of FIG. 15, the refresh clock generator 310 may decrease the period of the refresh clock signal RCK by a half when compared with the case of FIG. 14.

Figure 16:
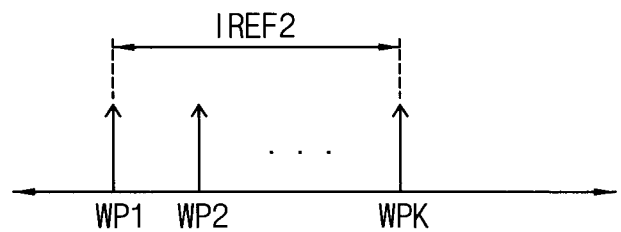
FIG. 16 illustrates that the weak refresh operation is performed on the weak pages in the normal access mode of the semiconductor memory device of FIG. 3, according to one embodiment.

FIG. 16 illustrates that the weak refresh operation is performed on the weak pages in the normal access mode of the semiconductor memory device of FIG. 3, according to one embodiment.

Referring to FIG. 16, the weak pages WP1~WPK in the memory cell array 280 are sequentially refreshed during the second refresh control signal IREF2 at a first logic level in the normal access mode of the semiconductor memory device 200a. FIG. 16 illustrates a case when the second refresh control signal IRFF2 indicates the immediate weak refresh operation in the refresh control circuit 300 of FIG. 5.

Figure 17:
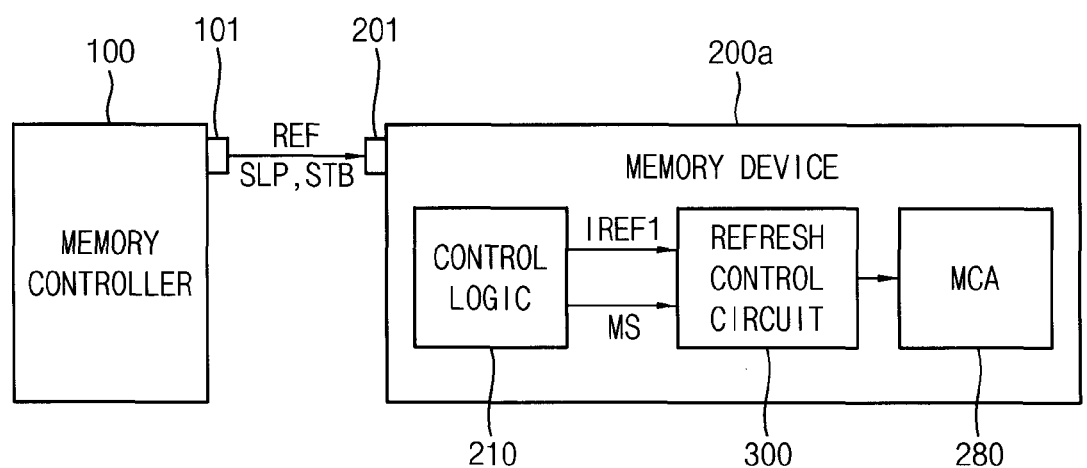
FIG. 17 illustrates that the refresh operation is performed in the auto refresh mode or the self refresh mode in the memory system of FIG. 2, according to one embodiment.

FIG. 17 illustrates that the refresh operation is performed in the auto refresh mode or the self refresh mode in the memory system of FIG. 2, according to one embodiment.

Referring to FIG. 17, the memory controller 100 transmits a refresh command REF to the semiconductor memory device 200a in the auto refresh mode. The memory controller 100 may transmit a sleep mode signal SLP or a stand-by signal STB in the self refresh mode. The control logic 210 may provide the refresh control circuit 300 with the first refresh control signal IREF1 and the mode signal MS in response to the refresh command REF, the sleep mode signal SLP or the stand-by signal STB. When the mode signal MS directs the parallel refresh mode, the refresh control circuit 300 may generate the weak page addresses simultaneously while generating the counting address CNT_ADDR for all memory cell rows. Therefore, each of the weak pages is refreshed when a corresponding memory cell row whose page address is different from the weak page only in the MSB is refreshed. When the mode signal MS directs the sequential refresh mode, the refresh control circuit 300 may generate the weak page addresses after the refresh control circuit 300 completes generation of the counting address CNT_ADDR for all memory cell rows. Therefore, the weak refresh operation is performed after the normal refresh operation is completed.

Figure 18:
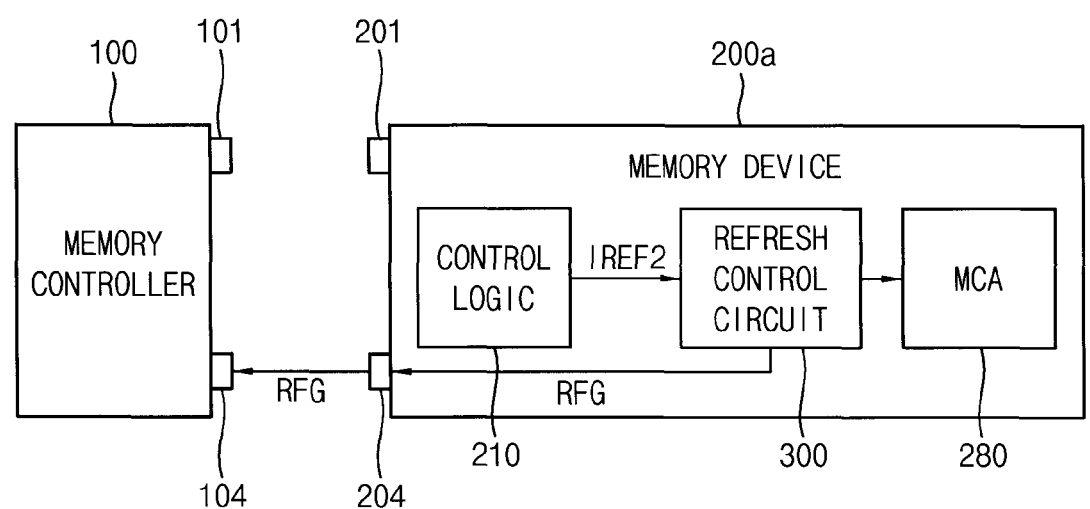
FIG. 18 illustrates that the immediate weak refresh operation is performed in the normal access mode in the memory system of FIG. 2, according to one embodiment.

FIG. 18 illustrates that the immediate weak refresh operation is performed in the normal access mode in the memory system of FIG. 2, according to one embodiment.

Referring to FIG. 18, when the control logic 210 is to refresh the weak pages immediately in the normal access mode, the control logic 210 provides the second refresh control signal IREF2 to the refresh control circuit 300. The refresh control circuit 300 may transmit the refresh flag signal RFG with a first logic level to the memory controller 100 through the refresh pins 204 and 104 during performing the weak refresh operation on the weak pages in response to the second refresh control signal IREF2. The memory controller 100 may hold an access to the semiconductor memory device 200a during the refresh flag signal RFG at a first logic level.

Figure 19:
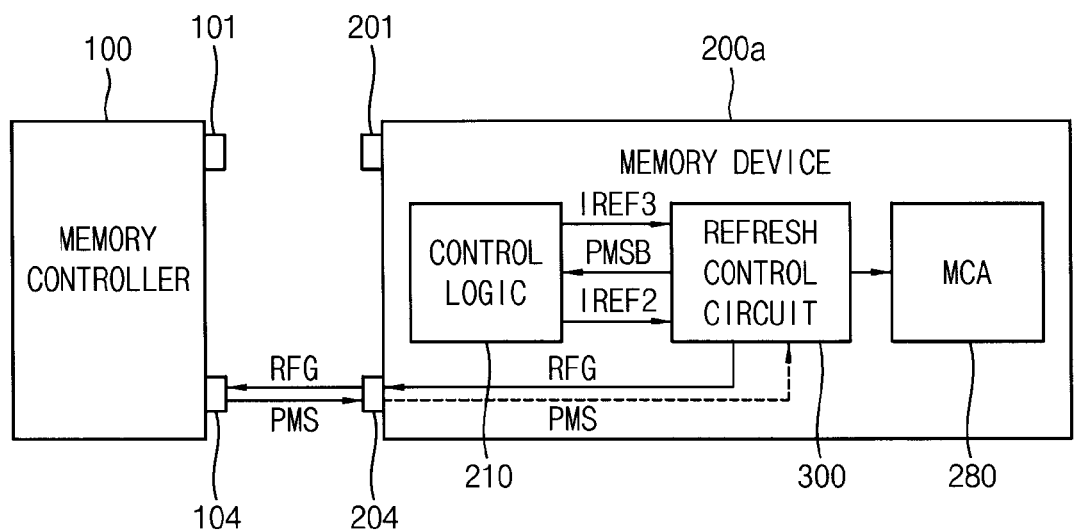
FIG. 19 illustrates that the conditional weak refresh operation is performed in the normal access mode in the memory system of FIG. 2, according to one embodiment.

FIG. 19 illustrates that the conditional weak refresh operation is performed in the normal access mode in the memory system of FIG. 2, according to one embodiment.

Referring to FIG. 19, when the control logic 210 needs permission from the memory controller for refreshing the weak pages in the normal access mode, the control logic 210 provides the third refresh control signal IREF3 to the refresh control circuit 300. The refresh control circuit 300 may transmit a short-pulsed type refresh flag signal RFG to the memory controller through the refresh pins 204 and 104. When the memory controller 100 completes an urgent task, the memory controller 100 may transmit the permission signal PMS to the refresh control circuit 300 through the refresh pins 104 and 204, in response to the refresh flag signal RFG. The refresh control circuit 300 provides the inverted permission signal PMSB to the control logic 210 in response to the permission signal PMS, and the control logic applies the second refresh control signal IREF2 to the refresh control circuit 300 in response to the inverted permission signal PMSB. The refresh control circuit 300 may perform the weak refresh operations on the weak pages in response to the second refresh control signal IREF2.

Figure 20:
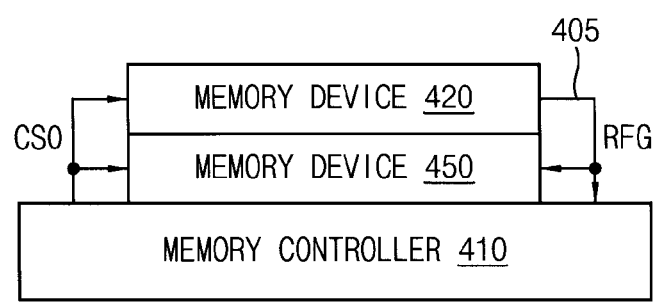
FIG. 20 is a block diagram illustrating a memory system according to example embodiments.

FIG. 20 is a block diagram illustrating a memory system according to example embodiments.

Referring to FIG. 20, a memory system 40 may include a memory controller 410, a first semiconductor memory device 420 and a second semiconductor memory device 450. The second semiconductor memory device 450 may be stacked on the memory controller 410 and the first semiconductor memory device 420 may be stacked on the second semiconductor memory device 450. The first and second semiconductor memory devices 420 and 450 may a portion of a plurality of semiconductor memory devices mounted on a memory module.

The memory controller 410, the first semiconductor memory device 420 and the second semiconductor memory device 450 may be connected to each other through a channel 405. The memory controller 410 may select the first semiconductor memory device 420 and the second semiconductor memory device 450 simultaneously using a chip selection signal CS0. Each of the first semiconductor memory device 420 and the second semiconductor memory device 450 may employ the semiconductor memory device 200a of FIG. 3.

The first semiconductor memory device 420 may have a first number of weak pages and the second semiconductor memory device 450 may have a second number of weak pages. The first number may be greater than the second number. Therefore, when each of the first semiconductor memory device 420 and the second semiconductor memory device 450 is to perform the weak refresh operation on the weak pages, the first semiconductor memory device 420 may inform the second semiconductor memory device 450 and the memory controller 410 of the weak refresh operation being performed using the refresh flag signal RFG because the first semiconductor memory device 420 has more weak pages than the second semiconductor memory device 450. The second semiconductor memory device 450 may perform the weak refresh operation on the second number of weak pages during the refresh flag signal RFG at a first logic level. In addition, the memory controller 410 may hold access to the first semiconductor memory device 420 and the second semiconductor memory device 450 during the refresh flag signal RFG at a first logic level.

Figure 21:
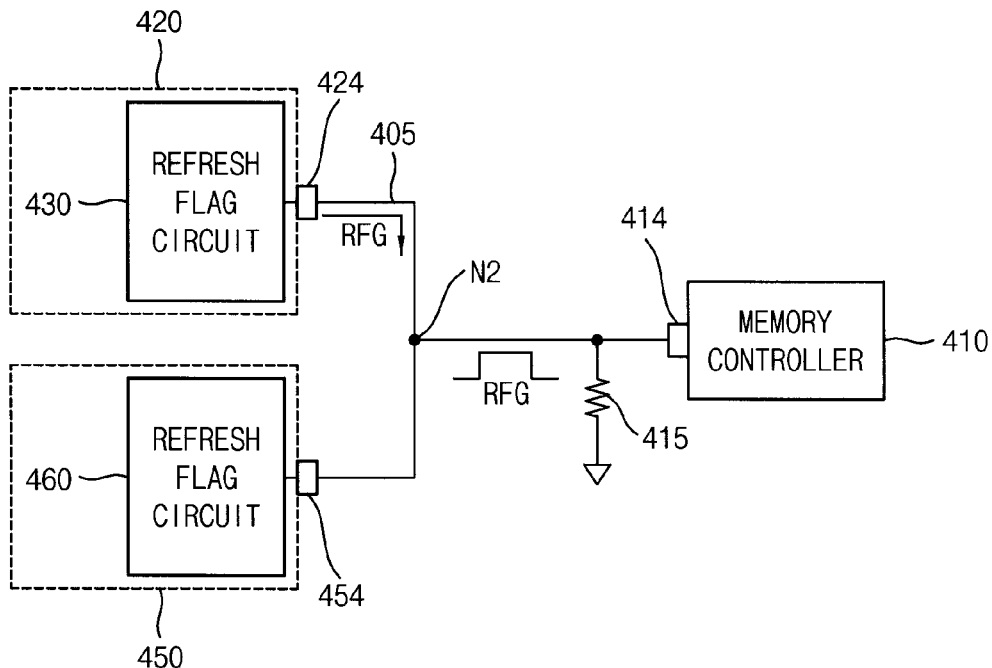
FIG. 21 illustrates a connection relationship between refresh flag circuits and the memory controller in the memory system shown in FIG. 20, according to one embodiment.

FIG. 21 illustrates a connection relationship between refresh flag circuits and the memory controller in the memory system in FIG. 20, according to one embodiment.

Referring to FIGS. 20 and 21, the first semiconductor memory device 420 may include a first refresh flag circuit 430, and the second semiconductor memory device 450 may include a second refresh flag circuit 460. Each of the first and second refresh flag circuit 430 and 460 may employ the refresh flag circuit 315 of FIG. 12. The first and second refresh flag circuit 430 and 460 may be connected to a refresh pin 141 of the memory controller 410 through respective refresh pins 424 and 454 at a node N2 of the channel 405. A resistor 414 external to the memory controller 410 is coupled between the node n2 and a ground voltage.

When the first semiconductor memory device 420 performs the weak refresh operation in the normal access mode, the first refresh circuit 430 may maintain the refresh flag signal RFG at a first logic level during the weak refresh operation being performed on the first number of the weak pages. The second refresh flag circuit 460 in the second semiconductor memory device 450 notifies a control logic in the second semiconductor memory device 450 of the weak refresh operation being performed on the first number of the weak pages, in response to the refresh flag signal RFG with a first logic level, and the control logic may provide a second refresh control signal to a refresh control circuit in the second semiconductor memory device 450. The refresh control circuit may perform the weak refresh operation on the second number of weak pages in response to the second refresh control signal, in the normal access mode.

Figure 22:
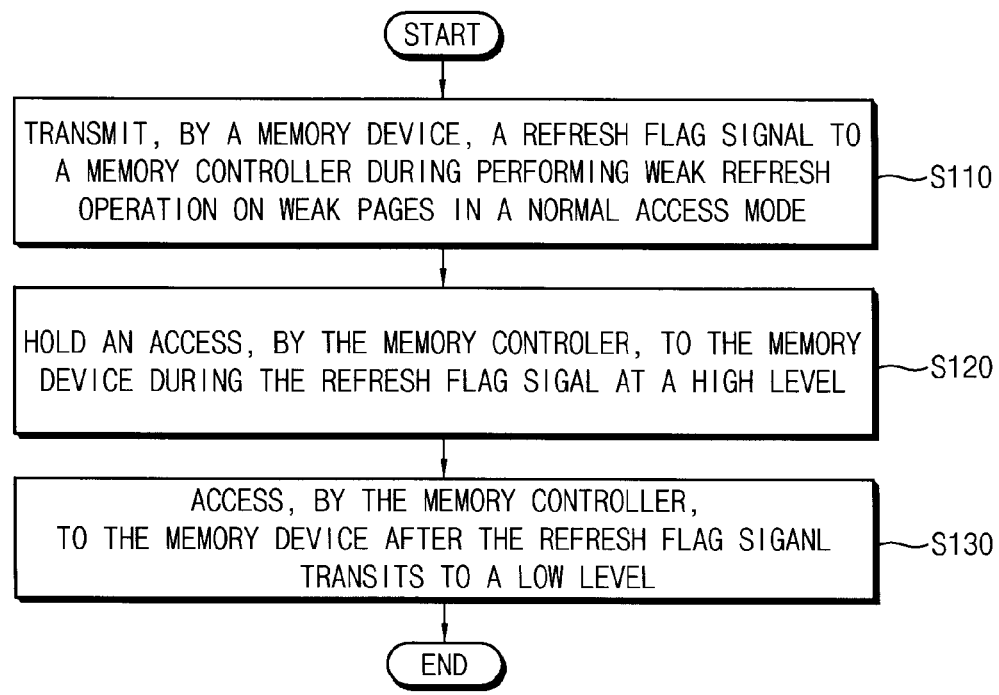
FIG. 22 is a flow chart illustrating a method of operating a memory system according to example embodiments.

FIG. 22 is a flow chart illustrating a method of operating a memory system according to example embodiments.

Referring to FIGS. 2, 3 through 19 and 22, in a method of operating a memory system including a semiconductor memory device 200a and a memory controller 100, the semiconductor memory device 200a transmits a refresh flag signal RFG to the memory controller 100 while the semiconductor memory device 200a performs a weak refresh operation on weak pages in a normal access mode (S110). The memory controller 100 holds an access to the semiconductor memory device 200a during the refresh flag signal RFG at a first logic level (S120). For example, the memory controller 100 may hold an access to the semiconductor memory device 200a during the weak refresh operation being performed on the weak pages. The memory controller 100 does not issue commands to the semiconductor memory device 200a during the refresh flag signal RFG at a first logic level. The memory controller 100 may access the semiconductor memory device 200a when the memory controller 100 detects the refresh flag signal RFG to a second logic level (S130). Thus, when the memory controller 100 detects the refresh flag signal RFG to a second logic level, the memory controller 100 may continue a normal access operation on the semiconductor memory device 200a by issuing commands to the semiconductor memory device 200a.

Figure 23:
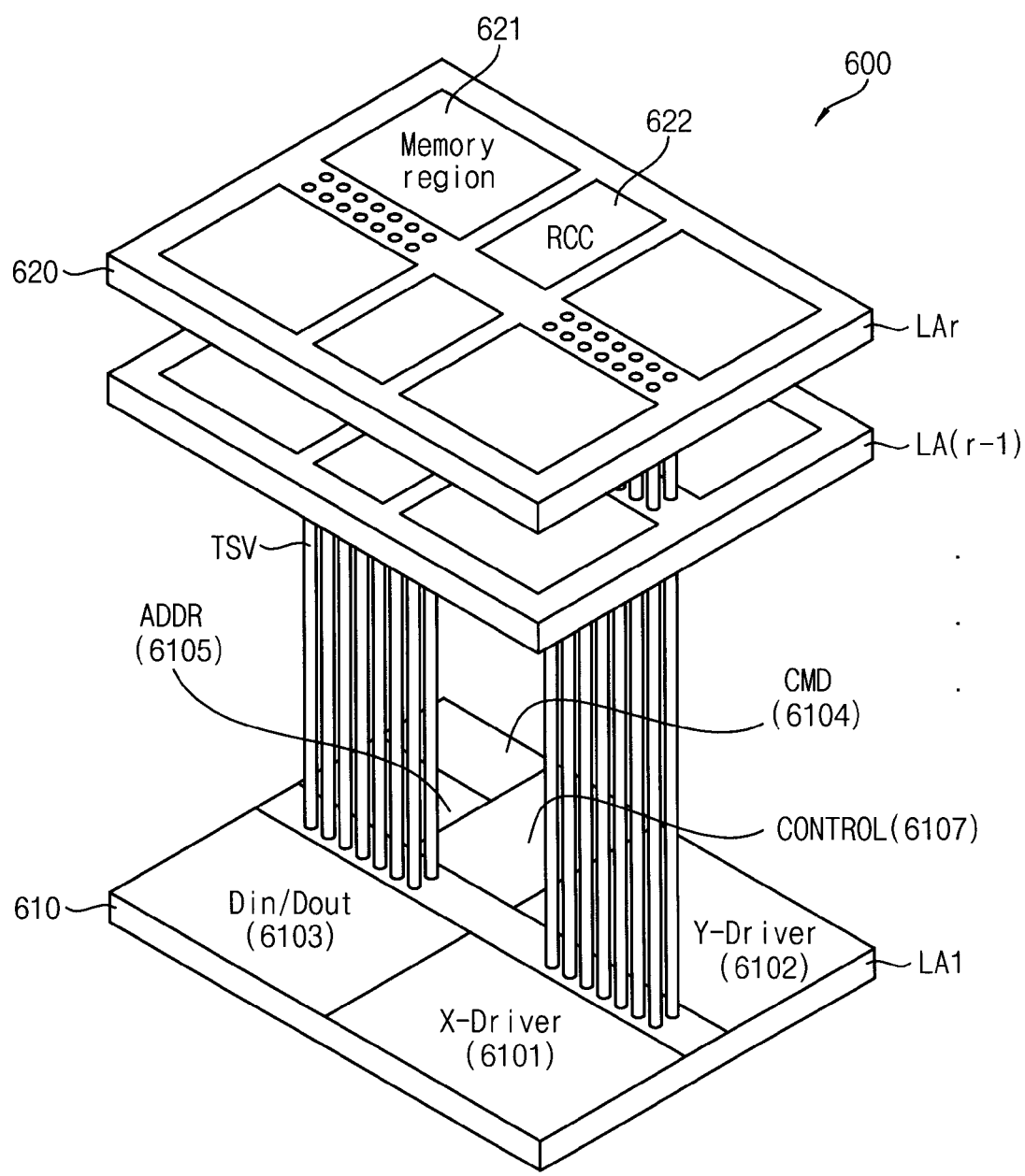
FIG. 23 is a structural diagram illustrating a semiconductor memory device according to example embodiments.

FIG. 23 is a structural diagram illustrating a semiconductor memory device according to example embodiments.

Referring to FIG. 23, a semiconductor memory device 600 may include first through rth semiconductor integrated circuit layers LA1 through LAr, in which the lowest first semiconductor integrated circuit layer LA1 is assumed to be an interface or master chip and the other semiconductor integrated circuit layers LA2 through LAr are assumed to be slave chips including core memory chips. The first through rth semiconductor integrated circuit layers LA1 through LAr may transmit and receive signals therebetween through through-silicon-vias (TSVs). The lowest first semiconductor integrated circuit layer LA1 as the interface or master chip may communicate with an external memory controller through a conductive structure formed on an external surface. A description will be made regarding structure and an operation of the semiconductor memory device 600 by mainly using the first semiconductor integrated circuit layer LA1 or 610 as the interface or master chip and the rth semiconductor integrated circuit layer LAr or 620 as the slave chip.

The first semiconductor integrated circuit layer 610 may include various peripheral circuits for driving memory regions 621 provided in the rth semiconductor integrated circuit layer 620. For example, the first semiconductor integrated circuit layer 610 may include a row (X)-driver 6101 for driving word-lines of a memory, a column (Y)-driver 6102 for driving bit-lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include a plurality of bank arrays in which a plurality of memory cells are arranged, and each of the plurality of bank arrays may include a plurality of memory cells as described with reference to FIGS. 3 and 4.

The first semiconductor integrated circuit layer 610 may further include a control logic 6107. The control logic 6107 may perform an auto refresh operation or a self refresh operation on the memory region 621 based on the command from the memory controller.

The rth semiconductor integrated circuit layer 620 may include the memory regions 621 including memory cell arrays and a refresh control circuit 622 that controls refresh operation of the memory regions 621. When the refresh control circuit 622 performs the auto refresh operation or the self refresh operation on the memory region 621 according to control of the control logic 6107, the refresh control circuit 622 may perform the weak refresh operation on the weak pages in parallel with the normal refresh operation or sequentially after the normal refresh operation is completed. In addition, the refresh control circuit 622 may hold the memory controller accessing the semiconductor memory device 600 by transmitting a refresh flag signal to the memory controller when the refresh control circuit 622 performs the weak refresh operation in the weak pages in a normal access mode.

Figure 24:
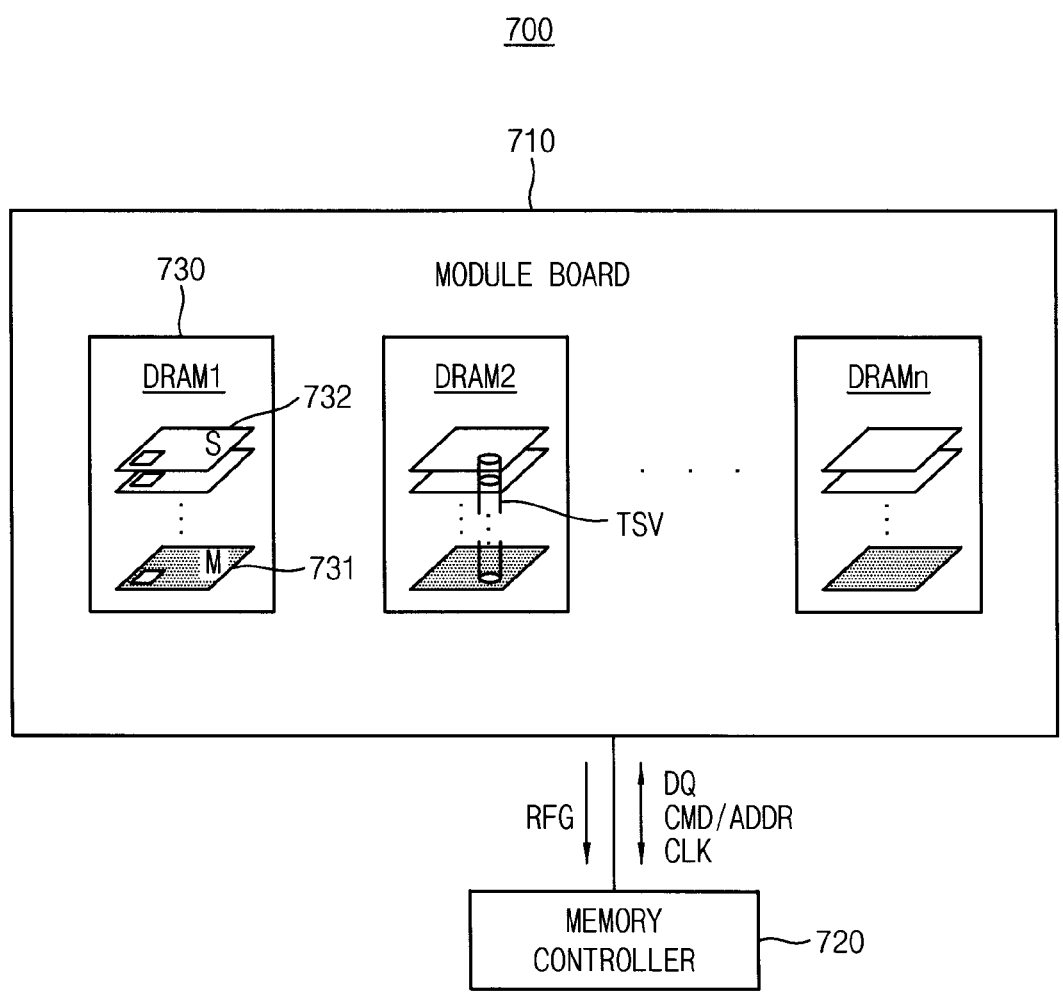
FIG. 24 illustrates a memory system including a semiconductor memory device in accordance with example embodiments.

FIG. 24 illustrates a memory system including the semiconductor memory device according to example embodiments.

Referring to FIG. 24, a memory system 700 may include a memory module 710 and a memory controller 720. The memory module 710 may include at least one semiconductor memory device 730 mounted on a module board. The semiconductor memory device 730 may employ the semiconductor memory device 200*a* of FIG. 3. For example, the semiconductor memory device 730 may be constructed as a DRAM chip. In addition, the semiconductor memory device 730 may include a stack of semiconductor chips. In this case, the semiconductor chips may include at least one master chip 731 and at least one slave chip 732. Signal transfer between the semiconductor chips may occur via through-silicon vias TSV.

The master chip 731 and the slave chip 732 may employ the semiconductor memory device 200*a* of FIG. 3. Therefore, each of the master chip 731 and the slave chip 732 may include a control logic, a refresh control circuit and a memory cell array as described with reference to FIGS. 3 through 16. When the refresh control circuit performs the auto refresh operation or the self refresh operation on the memory cell array according to control of the control logic, the refresh control circuit may perform the weak refresh operation on the weak pages in parallel with the normal refresh operation or sequentially after the normal refresh operation is completed. In addition, the refresh control circuit may hold the memory controller accessing the semiconductor memory device 730 by transmitting a refresh flag signal RFG to the memory controller 720 when the refresh control circuit performs the weak refresh operation in the weak pages in a normal access mode.

In addition, in an embodiment of the present inventive concept, a three dimensional (3D) memory array is provided in semiconductor memory device 730. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference in their entirety, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

The memory module 710 may communicate with the memory controller 720 via a system bus. Data DQ, a command/address CMD/ADDR, and a clock signal CLK may be transmitted and received between the memory module 710 and the memory controller 720 via the system bus.

Figure 25:
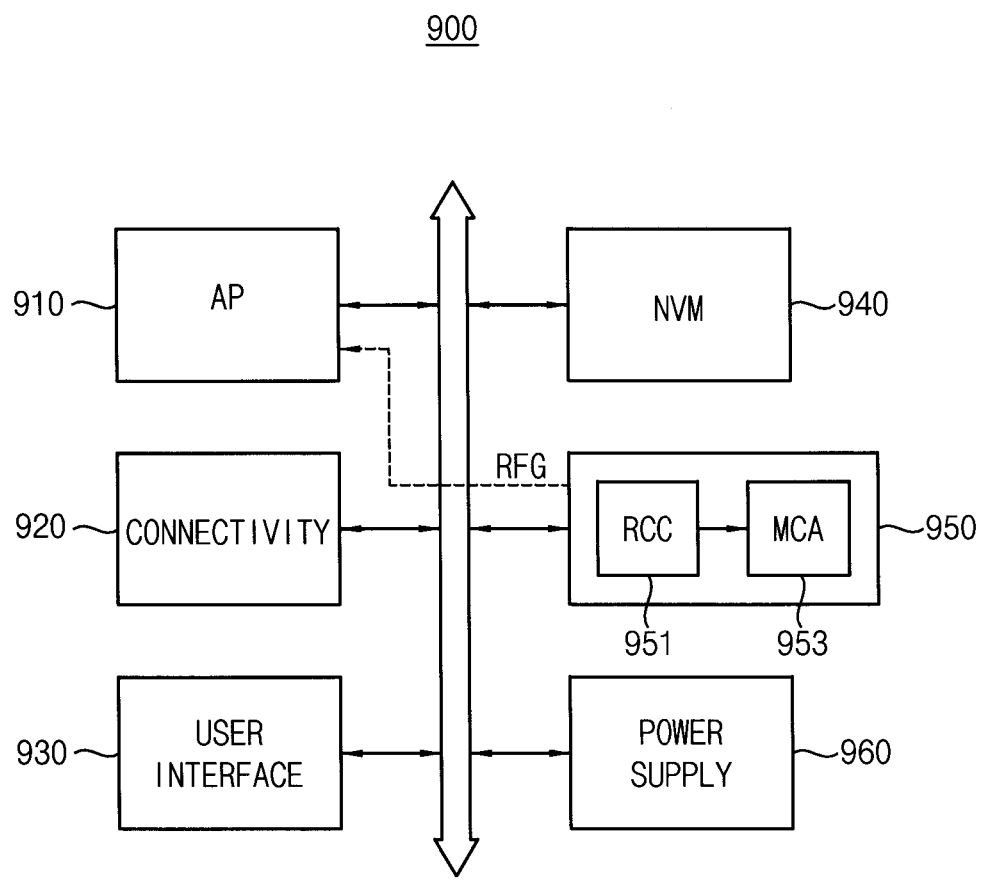
FIG. 25 is a block diagram illustrating a mobile system including a semiconductor memory device in accordance with example embodiments.

FIG. 25 is a block diagram illustrating a mobile system including the semiconductor memory device according to example embodiments.

Referring to FIG. 25, a mobile system 900 may include an application processor 910, a connectivity unit 920, a semiconductor memory device 950, a nonvolatile memory device 940, a user interface 930 and a power supply 960. In some embodiments, the mobile system 900 may be a mobile phone, a smart phone, a personal digital assistant (PDA), a portable multimedia player (PMP), a digital camera, a music player, a portable game console, a navigation system, etc.

The application processor 910 may execute applications, such as a web browser, a game application, a video player, etc. In some embodiments, the application processor 910 may include a single core or multiple cores. For example, the application processor 910 may be a multi-core processor, such as a dual-core processor, a quad-core processor, a hexa-core processor, etc. The application processor 910 may include an internal or external cache memory.

The connectivity unit 920 may perform wired or wireless communication with an external device. For example, the connectivity unit 920 may perform Ethernet communication, near field communication (NFC), radio frequency identification (RFID) communication, mobile telecommunication, memory card communication, universal serial bus (USB) communication, etc. In some embodiments, the connectivity unit 920 may include a baseband chipset that supports communications, such as global system for mobile communications (GSM), general packet radio service (GPRS), wideband code division multiple access (WCDMA), high speed downlink/uplink packet access (HSxPA), etc.

The semiconductor memory device 950 may store data processed by the application processor 910 or operate as a working memory. The semiconductor memory device 950 may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc. The semiconductor memory device 950 may employ the semiconductor memory device 200*a* of FIG. 3. Therefore, the semiconductor memory device 950 may include a control logic, a refresh control circuit 951 and a memory cell array 953 as described with reference to FIGS. 3 through 16. When the refresh control circuit 951 performs the auto refresh operation or the self refresh operation on the memory cell array 953 according to control of the control logic, the refresh control circuit 951 may perform the weak refresh operation on the weak pages in parallel with the normal refresh operation or sequentially after the normal refresh operation is completed. In addition, the refresh control circuit 951 may hold the application processor 910 accessing the semiconductor memory device 950 by transmitting a refresh flag signal RFG to the application processor 910 when the refresh control circuit 951 performs the weak refresh operation in the weak pages in a normal access mode.

The nonvolatile memory device 940 may store a boot image for booting the mobile system 900. For example, the nonvolatile memory device 940 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 930 may include at least one input device, such as a keypad, a touch screen, etc., and at least one output device, such as a speaker, a display device, etc. The power supply 960 may supply a power supply voltage to the mobile system 900. In some embodiments, the mobile system 900 may further include a camera image processor (CIS), and/or a storage device, such as a memory card, a solid state drive (SSD), a hard disk drive (HDD), a CD-ROM, etc.

In some embodiments, the mobile system 900 and/or components of the mobile system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 26:
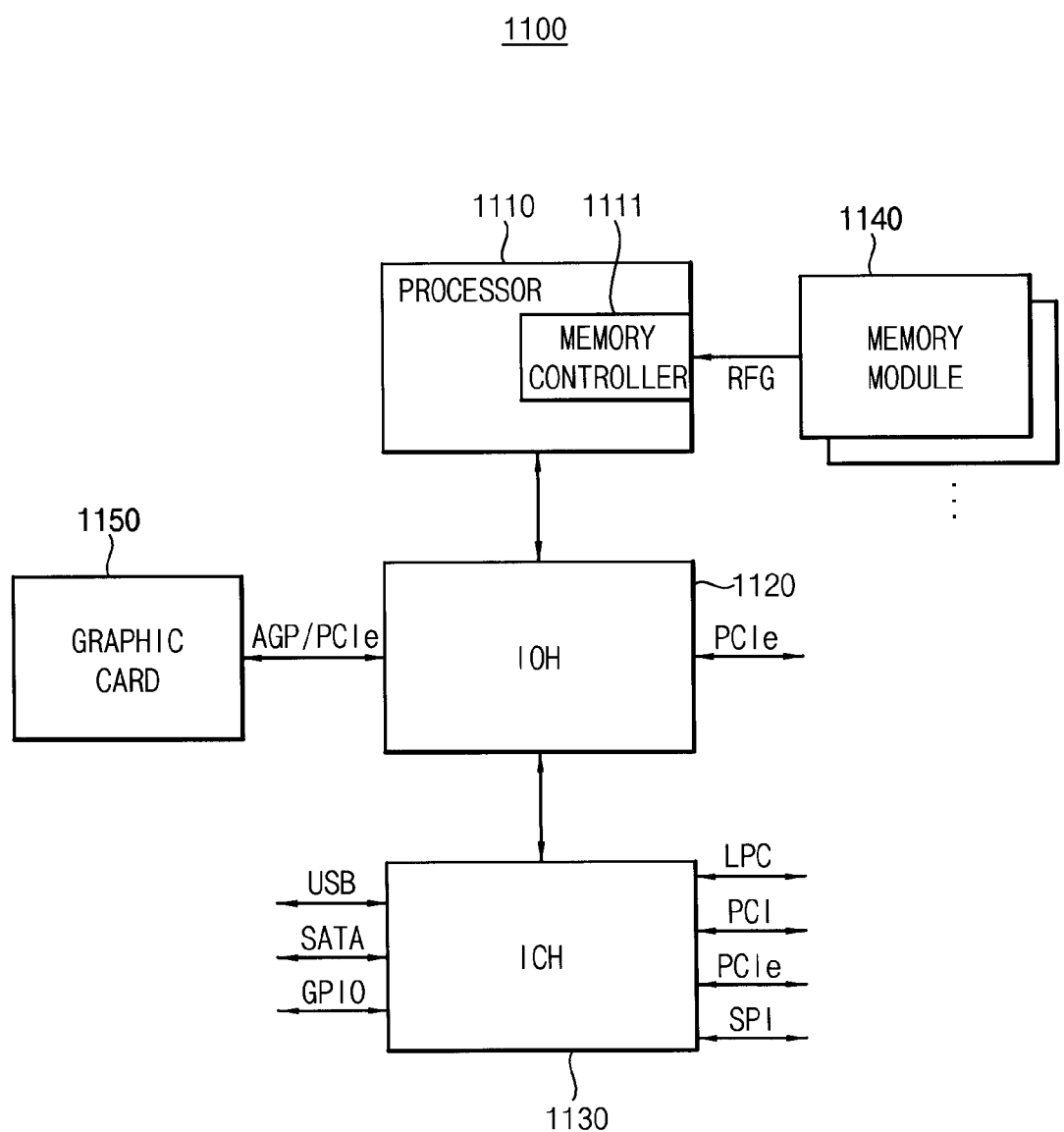
FIG. 26 is a block diagram illustrating a computing system including a semiconductor memory device in accordance with example embodiments.

FIG. 26 is a block diagram illustrating a computing system including the semiconductor memory device according to example embodiments.

Referring to FIG. 26, a computing system 1100 may include a processor 1110, an input/output hub (IOH) 1120, an input/output controller hub (ICH) 1130, at least one memory module 1140 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 26 illustrates the computing system 1100 including one processor 1110, in some embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In some embodiments, the memory controller 1111 may be located inside the input/output hub 1120, which may be referred to as a memory controller hub (MCH).

The memory module 1140 may include a plurality of semiconductor memory devices that store data provided from the memory controller 1111. Each of the plurality of semiconductor memory devices may employ the semiconductor memory device 200a of FIG. 3. Therefore, each of the plurality of semiconductor memory devices may include a control logic, a refresh control circuit and a memory cell array as described with reference to FIGS. 3 through 16. When the refresh control circuit performs the auto refresh operation or the self refresh operation on the memory cell array according to control of the control logic, the refresh control circuit may perform the weak refresh operation on the weak pages in parallel with the normal refresh operation or sequentially after the normal refresh operation is completed. In addition, the refresh control circuit may hold the memory controller 1111 accessing the semiconductor memory device by transmitting a refresh flag signal RFG to the memory controller 1111 when the refresh control circuit performs the weak refresh operation in the weak pages in a normal access mode.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a Quick-Path interconnect (QPI), a common system interface (CSI), etc. Although FIG. 26 illustrates the computing system 1100 including one input/output hub 1120, in some embodiments, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal semiconductor memory device. In some embodiments, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

Aspects of the present inventive concept may be applied to systems using memory controllers and semiconductor memory devices. Aspects of the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims.

What is claimed is:

1. A semiconductor memory device comprising:
    a memory cell array including a plurality of memory cell rows; and
    a refresh control circuit configured to perform a normal refresh operation on the plurality of memory cell rows and configured to perform a weak refresh operation on a plurality of weak pages of the plurality of memory cell rows, each of the weak pages including at least one weak cell whose data retention time is smaller than normal cells,
    wherein the refresh control circuit is configured to transmit a refresh flag signal to a memory controller external to the semiconductor memory device when the refresh control circuit performs the weak refresh operation on the weak pages, and
    wherein the refresh control circuit is configured to simultaneously perform the weak refresh operation on the weak pages with the normal refresh operation on the memory cell rows when the refresh control circuit performs the normal refresh operation on the memory cell rows in response to a first command from the memory controller.

2. The semiconductor memory device of claim 1, wherein the refresh control circuit is configured to maintain the refresh flag signal at a first logic level while the refresh control circuit performs the weak refresh operation on the weak pages.

3. The semiconductor memory device of claim 1, wherein while the refresh control circuit performs the normal refresh operation on the memory cell rows, the refresh control circuit is configured to simultaneously refresh a corresponding weak page when the refresh control circuit refreshes a first memory cell row of the memory cell rows, the first memory cell row having a first page address which is the same as one of weak page addresses of the weak pages except that the first page address differs from the one of the weak page addresses by one bit.

4. The semiconductor memory device of claim 1, wherein the first command from the memory controller is one of an auto refresh command, a stand-by signal, and a sleep mode signal.

5. The semiconductor memory device of claim 1, wherein the memory cell array is a three dimensional memory cell array, and
    wherein the refresh control circuit is configured to perform the weak refresh operation on the weak pages after the normal refresh operation on the memory cell rows is completed when the refresh control circuit performs the normal refresh operation on the memory cell rows in response to a second command different from the first command from the memory controller.

6. The semiconductor memory device of claim 5, wherein the refresh control circuit is configured to perform the normal refresh operation during a first interval in a refresh period defined in a specification of the semiconductor memory device, and is configured to perform the weak refresh operation during a second interval in the refresh period.

7. The semiconductor memory device of claim 1, wherein the refresh control circuit comprises:
    a refresh clock generator configured to generate a refresh clock signal in response to a first refresh control signal, a second refresh control signal, and a mode signal;
    a refresh counter configured to generate counting addresses for sequentially refreshing the memory cell rows in response to the refresh clock signal, the refresh counter outputting a done signal upon generating a maximum counting address;
    a weak page address generator that stores weak page addresses of the weak pages, the weak page address generator configured to output the weak page addresses in response to the refresh clock signal;
    an address comparing circuit configured to compare the counting address with each of the weak page addresses to output a first match signal and a second match signal;
    a control signal generator configured to generate a plurality of control signals based on the first refresh control signal, the second refresh control signal, the mode signal, the done signal, the first match signal, and the second match signal;
    an address converter configured to generate a changed refresh row address by do-not-care processing at least one bit of the counting address, in response to a third control signal of the plurality of the control signals; and
    a refresh address output circuit configured to output one of the counting address, the weak page address, and the changed refresh row address as a refresh row address according to a refresh mode, based on a first control signal and a second control signal of the plurality of the control signals.

8. The semiconductor memory device of claim 7, wherein the refresh address output circuit comprises:
    a first multiplexer that selects one of the counting address and the weak page address in response to the first control signal; and
    a second multiplexer that selects one of the changed refresh row address and an output of the first multiplexer to output the refresh row address in response to the second control signal.

9. The semiconductor memory device of claim 7, wherein the control signal generator is:
    configured to output the second control signal and the third control signal with a second logic level when the first refresh control signal indicates one of an auto refresh operation and a self refresh operation on the memory cell rows and the mode signal indicates a parallel mode of the weak refresh operation on the weak pages; or
    configured to output the second control signal and the first controls signal with a first logic level and a second logic level respectively, and configured to transit the first control signal to a first logic level in response to the done signal transitioning to a first logic level when the first refresh control signal indicates one of an auto refresh operation and a self refresh operation on the memory cell rows and the mode signal indicates a sequential mode of the weak refresh operation on the weak pages.

10. The semiconductor memory device of claim 7, wherein the control signal generator is configured to output the first control signal and the second control signal with a first logic level when the second refresh control signal indicates the weak refresh operation on the weak pages in the normal access mode, and wherein the refresh control circuit further comprises a refresh flag circuit configured to receive the second refresh control signal, configured to maintain the refresh flag signal at the first logic level during the second refresh control signal at the first logic level, and configured to transmit the refresh flag signal with a first logic level to the memory controller via a refresh pin.

11. A memory system comprising:
a first semiconductor memory device; and
a memory controller configured to control at least the first semiconductor memory device, the first semiconductor memory device comprising:
a memory cell array including a plurality of memory cell rows; and
a refresh control circuit configured to perform a normal refresh operation on the plurality of memory cell rows and configured to perform a weak refresh operation on a plurality of weak pages of the plurality of memory cell rows, each of the weak pages including at least one weak cell whose data retention time is smaller than normal cells,
wherein the refresh control circuit is configured to transmit a refresh flag signal to the memory controller through a refresh pin when the refresh control circuit performs the weak refresh operation on the weak pages, and
wherein the memory controller is configured to withhold an access to the first semiconductor memory device during the refresh flag signal being at a first logic level.

12. The memory system of claim 11, wherein the memory controller is configured to transmit a permission signal in response to the refresh flag signal to the refresh control circuit through the refresh pin, and
wherein the refresh control circuit is configured to perform the weak refresh operation after the refresh control circuit receives the permission signal.

13. The memory system of claim 11, further comprising:
a second semiconductor memory device,
wherein the first semiconductor memory device and the second semiconductor memory device are commonly selected by one chip selection signal from the memory controller,
wherein a number of first weak pages of the first semiconductor memory device is greater than a number of second weak pages of the second semiconductor memory device, and wherein the second semiconductor memory device performs a second weak refresh operation on the second weak pages while the first semiconductor memory device performs a first weak refresh operation on the first weak pages.

14. The memory system of claim 13, wherein when the first semiconductor memory device performs the first weak refresh operation on the first weak pages, the first semiconductor memory device transmits the refresh flag signal with a first logic level to a second refresh pin of the second semiconductor memory device and a third refresh pin of the memory controller through a first refresh pin of the first semiconductor memory device.

15. A method of operating a memory system comprising a first semiconductor memory device and a memory controller configured to control at least the first semiconductor memory device, the method comprising:
transmitting a refresh flag signal from the first semiconductor memory device to the memory controller when the first semiconductor memory device performs a weak refresh operation on weak pages of a plurality of memory cell rows, each of the weak pages including at least one weak cell whose data retention time is smaller than normal cells; and
withholding of the memory controller to access the first semiconductor memory device during the refresh flag signal maintaining a first logic level.

16. The method of claim 15, further comprising:
the memory controller accessing the first semiconductor memory device in response to the refresh flag signal transitioning to a second logic level.

17. The method of claim 15, further comprising:
operating a second semiconductor memory device,
wherein the first semiconductor memory device is configured to perform the weak refresh operation on the weak pages in parallel with a normal refresh operation on the memory cell rows when the second semiconductor memory device performs the normal refresh operation on the memory cell rows in response to a command from the memory controller.

18. The method of claim 15, further comprising:
operating a second semiconductor memory device,
wherein the first semiconductor memory device is configured to perform the weak refresh operation on the weak pages after a normal refresh operation on the memory cell rows is completed when the second semiconductor memory device performs the normal refresh operation on the memory cell rows in response to a command from the memory controller.

* * * * *